United States Patent
Hashimoto

(10) Patent No.: US 10,404,038 B2
(45) Date of Patent: Sep. 3, 2019

(54) QUANTUM CASCADE LASER

(71) Applicant: SUMITOMO ELECTRIC INDUSTRIES, LTD., Osaka (JP)

(72) Inventor: Jun-ichi Hashimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/011,869

(22) Filed: Jun. 19, 2018

(65) Prior Publication Data

US 2018/0375294 A1 Dec. 27, 2018

(30) Foreign Application Priority Data

Jun. 22, 2017 (JP) .................. 2017-122339
Jun. 27, 2017 (JP) .................. 2017-125267

(51) Int. Cl.
*H01S 5/00* (2006.01)
*H01S 5/02* (2006.01)
(Continued)

(52) U.S. Cl.
CPC .......... *H01S 5/3402* (2013.01); *H01S 5/0071* (2013.01); *H01S 5/0203* (2013.01);
(Continued)

(58) Field of Classification Search
CPC ....... H01S 5/3401–5/3402; H01S 5/16–5/168; H01S 5/028–5/0288; H01S 5/22–5/24;
(Continued)

(56) References Cited

U.S. PATENT DOCUMENTS 4,751,710 A * 6/1988 Yamaguchi ........... H01S 5/0264
372/44.01
5,180,685 A * 1/1993 Yamamoto .......... H01L 33/0062
148/DIG. 72

(Continued)

FOREIGN PATENT DOCUMENTS

DE 102008045980 A1 * 6/2010 ............. B82Y 20/00
DE 102015116335 A1 * 3/2017 ........... H01S 5/0421

OTHER PUBLICATIONS

S.R. Dervish, et al., "High-power, continuous-wave operation of distributed-feedback quantum-cascade lasers at λ 7.8 μm", *Applied Physics Letters*, 89, 251119 (2006).

(Continued)

*Primary Examiner* — Joshua King
(74) *Attorney, Agent, or Firm* — Smith, Gambrell & Russell, LLP

(57) ABSTRACT

A quantum cascade laser includes: a semiconductor device portion having a substrate, a semiconductor laminate, and a semiconductor insulating portion, the semiconductor laminate having a principal surface, the substrate having a back surface and a substrate end face, the semiconductor laminate having a laminate end face, the semiconductor insulating portion and the substrate being arranged along a reference plane intersecting the second direction, the semiconductor device portion having a front end face and a rear end face, the front end face and the rear end face being arranged in the second direction, the rear end face including the substrate end face, and the substrate end face extending along the reference plane; a first electrode disposed on the semiconductor laminate; and a metal film disposed on the rear end face, the semiconductor insulating portion and the second electrode, the metal film being apart from the first electrode.

12 Claims, 24 Drawing Sheets

(51) Int. Cl.
  *H01S 5/12* (2006.01)
  *H01S 5/34* (2006.01)
  *B82Y 20/00* (2011.01)

(52) U.S. Cl.
  CPC .......... *H01S 5/0216* (2013.01); *H01S 5/1237* (2013.01); *B82Y 20/00* (2013.01)

(58) Field of Classification Search
  CPC .......... H01S 5/02236–5/02276; H01S 5/0226; H01S 5/02272; H01S 5/02469; H01S 5/02484; H01S 5/02476; H01S 5/02492
  See application file for complete search history.

(56) References Cited

U.S. PATENT DOCUMENTS

| | | | | |
|---|---|---|---|---|
| 5,677,922 | A * | 10/1997 | Hayafuji | B82Y 20/00 372/46.01 |
| 5,943,553 | A * | 8/1999 | Spaeth | H01L 33/641 372/107 |
| 6,289,030 | B1 * | 9/2001 | Charles | H01L 31/02161 257/437 |
| 6,326,646 | B1 * | 12/2001 | Baillargeon | B82Y 20/00 257/94 |
| 6,355,505 | B1 * | 3/2002 | Maeda | H01S 5/02236 438/122 |
| 6,647,047 | B2 * | 11/2003 | Yokota | H01S 5/0281 372/49.01 |
| 6,710,375 | B2 * | 3/2004 | Oshima | H01S 5/0281 257/21 |
| 9,184,563 | B1 * | 11/2015 | Raring | H01S 5/2201 |
| 2003/0035453 | A1 * | 2/2003 | Fitz | H01S 5/028 372/49.01 |
| 2004/0101013 | A1 * | 5/2004 | Yokota | H01S 5/028 372/46.013 |
| 2004/0233950 | A1 * | 11/2004 | Furukawa | H01S 5/028 372/43.01 |
| 2004/0238810 | A1 * | 12/2004 | Dwilinski | B82Y 20/00 257/12 |
| 2005/0151150 | A1 * | 7/2005 | Choi | H01S 5/0425 257/99 |
| 2006/0239321 | A1 * | 10/2006 | Kume | B82Y 20/00 372/50.121 |
| 2006/0274804 | A1 * | 12/2006 | Behfar | H01S 5/028 372/49.01 |
| 2009/0067464 | A1 * | 3/2009 | Tanaka | B82Y 20/00 372/45.011 |
| 2009/0086782 | A1 * | 4/2009 | Yokoyama | B82Y 20/00 372/49.01 |
| 2013/0028280 | A1 * | 1/2013 | Hongo | H01S 5/02461 372/44.01 |
| 2013/0107534 | A1 * | 5/2013 | Avramescu | H01S 5/02461 362/259 |
| 2013/0250994 | A1 * | 9/2013 | Moenster | H01S 5/02272 372/50.12 |
| 2013/0301666 | A1 * | 11/2013 | Stagarescu | H01S 5/3013 372/44.01 |
| 2013/0322480 | A1 * | 12/2013 | Edamura | H01S 5/3401 372/45.01 |
| 2014/0211819 | A1 * | 7/2014 | Yoshida | H01S 5/02272 372/36 |
| 2014/0239250 | A1 * | 8/2014 | Fang | H01L 33/06 257/13 |
| 2015/0117484 | A1 * | 4/2015 | Sugiyama | H01S 5/0285 372/45.01 |
| 2018/0069374 | A1 | 3/2018 | Kakuno et al. | |

OTHER PUBLICATIONS

Manijeh Razeghi, "High-Performance InP-Based Mid-IR Quantum Cascade Lasers", *IEEE Journal of Selected Topics in Quantum Electronics*, vol. 15, No. 3, p. 941-951, May/Jun. 2009.

Notice of Allowance for U.S. Appl. No. 16/006,666 dated Apr. 3, 2019.

* cited by examiner

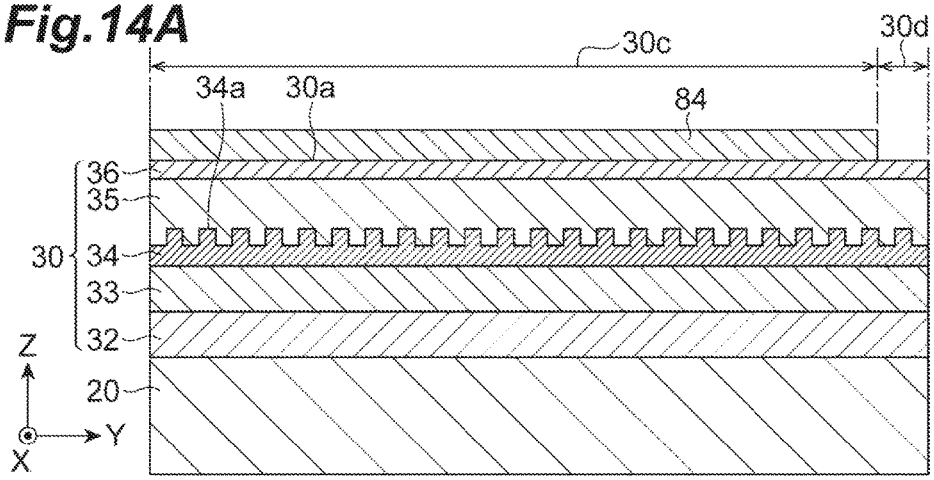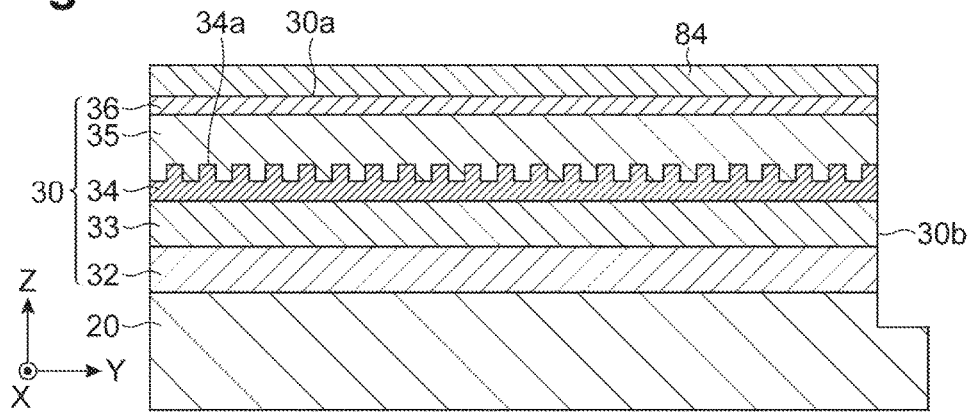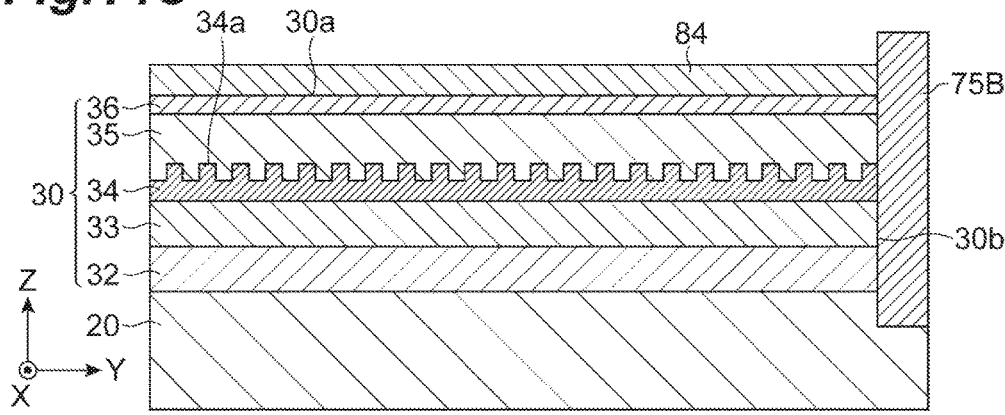

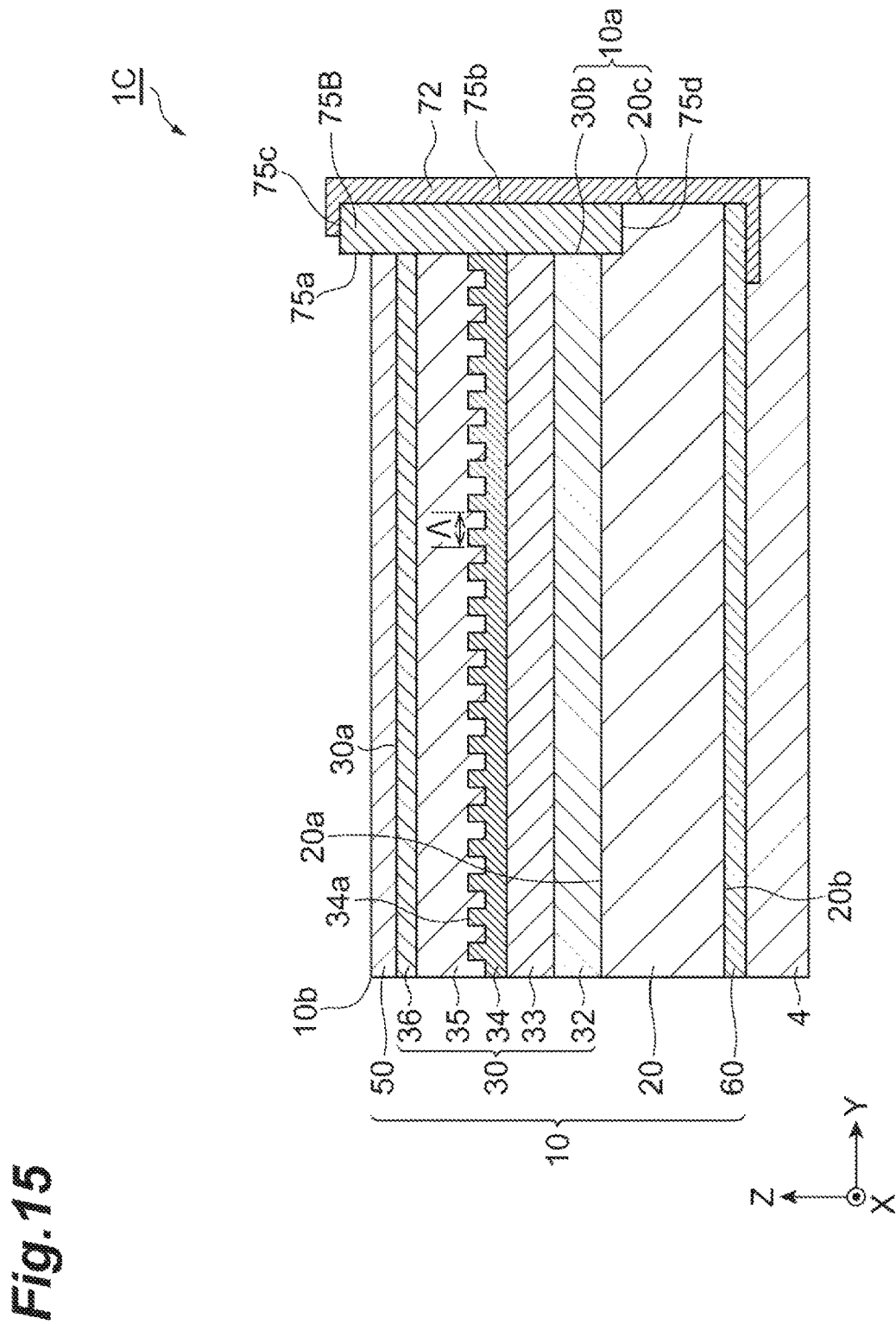

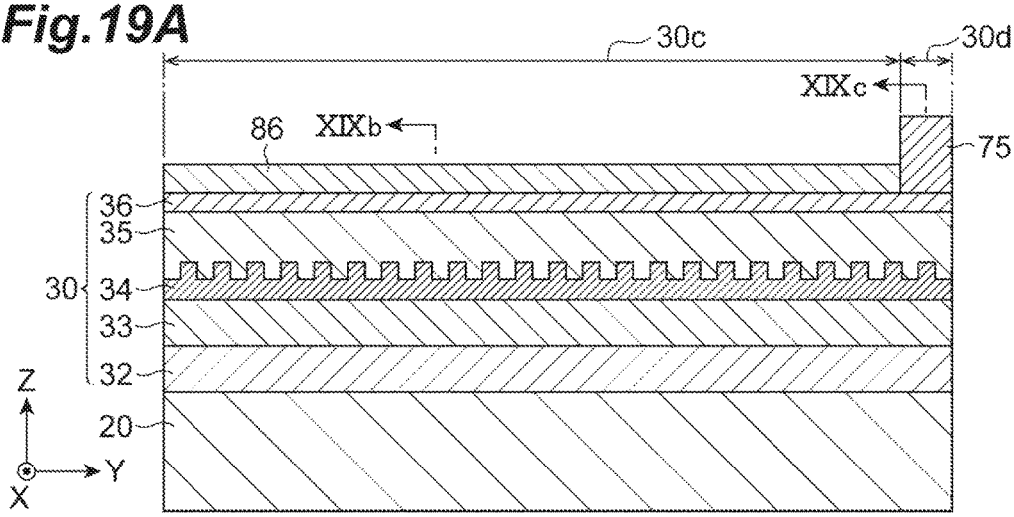
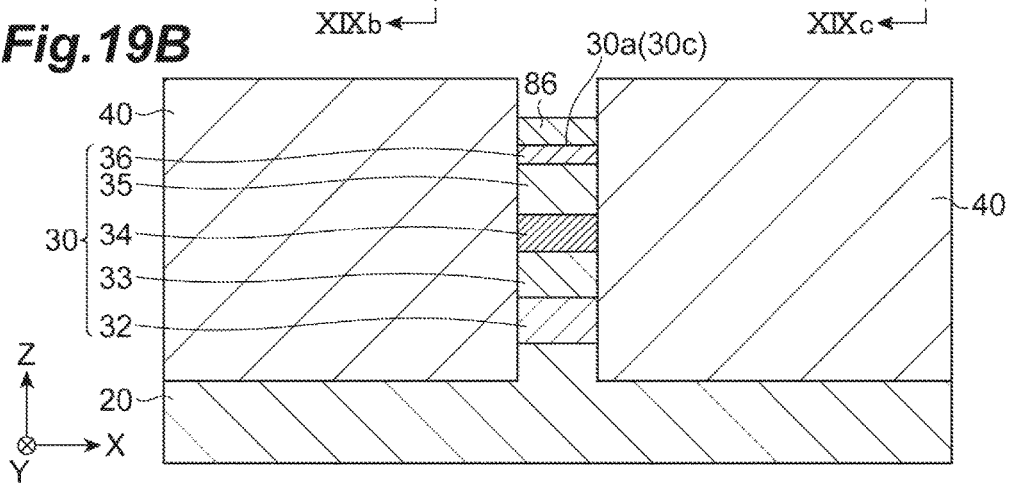
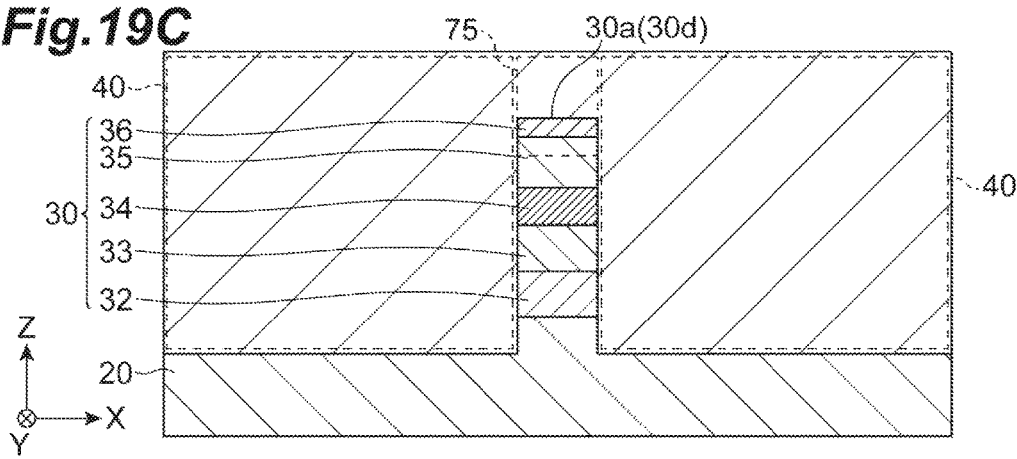

QUANTUM CASCADE LASER

BACKGROUND OF THE INVENTION

Field of the Invention

The present invention relates to a quantum cascade laser. This application claims the benefit of priorities from Japanese Patent Application No. 2017-122339 filed on Jun. 22, 2017 and Japanese Patent Application No. 2017-125267 filed on Jun. 27, 2017, which is herein incorporated by reference in their entirety.

Related Background Art

Non-Patent Document (S. R. Darvish, et al. "High-power, continuous-wave operation of distributed-feedback quantum-cascade lasers at λ 7.8 μm", Applied Physics Letters 89, 251119, 2006) discloses a quantum cascade laser.

SUMMARY OF THE INVENTION

A quantum cascade laser according to one aspect of the present invention includes: a semiconductor device portion including a substrate, a semiconductor laminate, and a semiconductor insulating portion, the substrate and the semiconductor laminate being arranged in a first direction, the semiconductor laminate being disposed on the substrate, the semiconductor laminate having a principal surface, the substrate having an back surface, the principal surface and the back surface being arranged in the first direction, the substrate having a substrate end face, the semiconductor laminate having a laminate end face, a core layer extending from the laminate end face in a second direction intersecting the first direction, and a cladding layer disposed on the core layer, the semiconductor insulating portion and the substrate being disposed along a reference plane intersecting the second direction, the semiconductor device portion having a front end face and a rear end face, the front end face and the rear end face being arranged in the second direction, the rear end face including the substrate end face, and the substrate end face extending along the reference plane; a first electrode disposed on the semiconductor laminate; a second electrode disposed on the back surface of the substrate; and a metal film disposed on the rear end face, the semiconductor insulating portion and the second electrode. The metal film is apart from the first electrode.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 14A is a perspective view showing a major process in a method for fabricating a quantum cascade semiconductor laser shown in FIG. 13.

FIG. 14B is a perspective view showing a major process in the method according to the embodiment.

FIG. 14C is a perspective view showing a major process in the method according to the embodiment.

FIG. 15 is a perspective view showing a quantum cascade semiconductor laser according to another modification to the second modified example.

FIG. 19A is a schematic view showing a major process in the method according to the embodiment.

FIG. 19B is a schematic view showing a major process in the method according to the embodiment.

FIG. 19C is a schematic view showing a major process in the method according to the embodiment.

DESCRIPTION OF THE EMBODIMENTS

Figure 1:
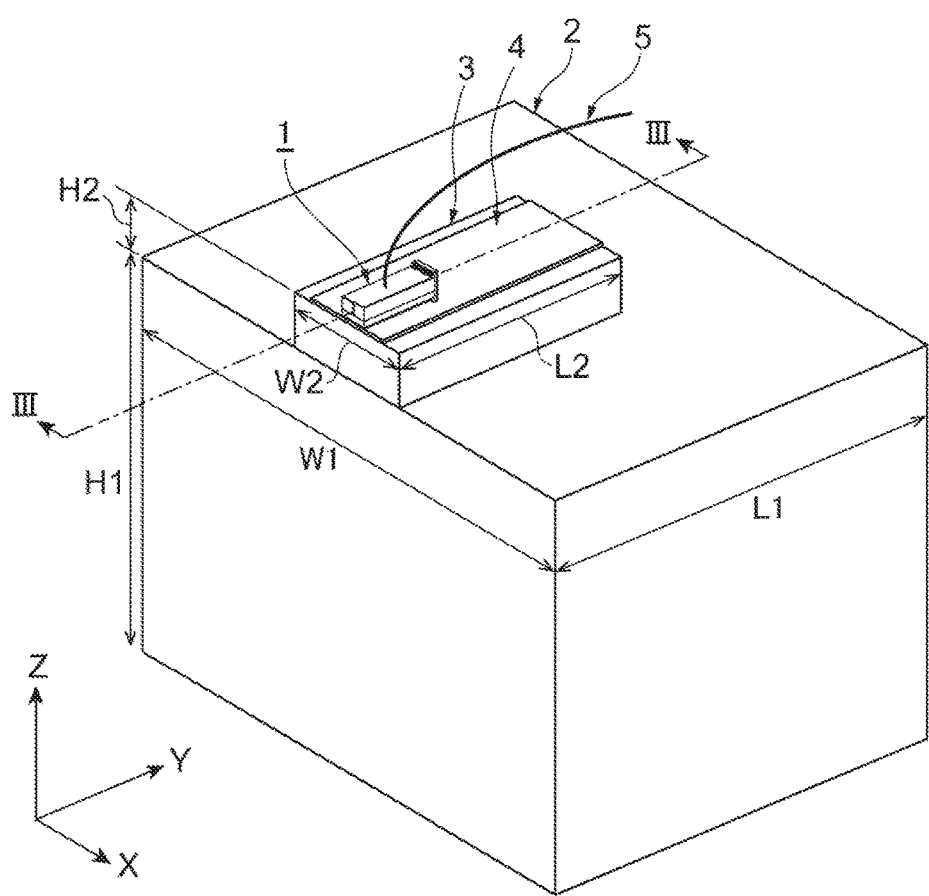
FIG. 1 is a perspective view showing a quantum cascade semiconductor laser, which is die-bonded, according to an embodiment.

A quantum cascade laser includes a lower electrode, a semiconductor substrate, a semiconductor laminate, and an upper electrode, which are arranged to form a device structure. The quantum cascade laser further has a metal film for the lasing cavity and an insulating film on the end face with the insulating film disposed between the metal film and the end face. The insulating film is made of $SiO_2$, and the metal film is made of Au. This quantum cascade laser is mounted on an electronic component with solder material.

The quantum cascade laser is provided with the laser cavity including the end face, and may have a reflection film made of a metal film, which is formed on the end face, making the reflectance at the end face enhanced. A metal film making direct contact with the end face that includes end faces of layers of the semiconductor device causes short circuit at the end face. The quantum cascade laser is provided with an insulating film, which is disposed between the end face and the metal film, to separate the metal film from the end face. The insulating film and the metal film are sequentially formed on the end face by supplying respective raw materials toward the end face. In forming these films, the raw materials thereof fly along the upper and lower electrodes to form deposited materials on these electrodes, thereby providing the quantum cascade laser with the insulating film and the metal film on the end face. This quantum cascade laser can be mounted on the electronic component, for example, with solder material, so that the deposited metallic material on the lower electrode comes in contact with the solder material. The quantum cascade laser thus mounted, which causes the solder material to connect the lower electrode to the metallic deposited material, receives a voltage (for example, a voltage of 10 volts or more) applied between the upper and lower electrodes for lasing, so that the high voltage is applied to the metal film. This high voltage on the metal film is finally applied to the insulating film between the upper electrode and the deposited metallic material on the upper electrode.

The deposited material for the insulating film, however, has an extremely small thickness on the upper electrode, which is smaller than (as small as, for example, about one severalth of) that of the insulating film on the end face. The application of a high voltage of, for example, 10 volts or more to the extremely thin deposited material for the insulating film between the upper electrode and the metal film thereon may break down the extremely thin deposited material in the vicinity of the end face to form a broken-down portion, so that a large amount of current (referred to as inrush current) flows through the broken-down portion in the deposited material, leading to a failure, such as breakdown of the end face, in the quantum cascade laser.

Forming a thick deposited material on the upper electrode makes a thickness of the insulating film on the end face large (for example, a thickness several times larger than a target thickness). Forming this thick insulating film makes a deposition time long, resulting in reduction in the productivity of the quantum cascade laser. Further, the thick insulating film on the end face may produce an additional stress to the end face, resulting in deterioration of the end face in quality, and occurrence of cracking and/or peeling of the insulating film.

It is an object of the one aspect of the present invention to provide a quantum cascade laser, which has a metal film on an end face, capable of reducing the occurrence of break-down in the vicinity of the rear end face.

A description will be given of embodiments according to the above aspect below.

A quantum cascade laser according to an embodiment includes: (a) a semiconductor device portion including a substrate, a semiconductor laminate, and a semiconductor insulating portion, the substrate and the semiconductor laminate being arranged in a first direction, the semiconductor laminate being disposed on the substrate, the semiconductor laminate having a principal surface, the substrate having an back surface, the principal surface and the back surface being arranged in the first direction, the principal surface being opposite to the back surface, the substrate having a substrate end face, the semiconductor laminate having a laminate end face, a core layer extending from the laminate end face in a second direction intersecting the first direction, and a cladding layer disposed on the core layer, the semiconductor insulating portion and the substrate being disposed along a reference plane intersecting the second direction, the semiconductor device portion having a front end face and a rear end face, the front end face and the rear end face being arranged in the second direction, the rear end face including the substrate end face, and the substrate end face extending along the reference plane; (b) a first electrode disposed on the semiconductor laminate; (c) a second electrode disposed on the back surface of the substrate; and (d) a metal film disposed on the rear end face, the semiconductor insulating portion and the second electrode. The metal film is apart from the first electrode.

The quantum cascade laser, which is mounted on an electronic component with a solder material, receives an external voltage (for example, a high voltage of 10 volts) between the first electrode and the second electrode to lase. This external voltage is also applied to the metal film through the solder material, which makes contact with the metal film, and finally applied between the metal film and the first electrode. The quantum cascade laser is provided with the semiconductor insulating portion, which is between the metal film and the first electrode on the principal surface in the first direction and extends from the rear end face in the second direction so as not to be disposed on the rear end face, so that the semiconductor insulating portion is provided with a large thickness, which allows an insulating region (an insulator between the first electrode and the metal film) to have an excellent insulating property. This insulating region can endure the external voltage applied between the first electrode and the metal film. The quantum cascade laser can hinder the applied voltage from breaking down the insulating region, thereby avoiding the deterioration of its device characteristics, which may be caused by breakage of an end face resulting from the breakdown of the insulating region.

In the quantum cascade laser according to an embodiment, the principal surface of the semiconductor laminate has a first area and a second area; the first area and the second area of the principal surface are arranged in the second direction; the second area of the principal surface is disposed between the laminate end face and the first area of the principal surface; the semiconductor insulating portion is on the second area of the principal surface; and the first electrode has an end apart from the laminate end face and the second area of the principal surface.

In the quantum cascade laser according to an embodiment, the semiconductor insulating portion has an outer side face and an inner side face; the outer side face and the substrate end face are arranged along the reference plane; and the inner side face of the semiconductor insulating portion is inclined with the principal surface of the semiconductor laminate to form an acute angle. This inclination hinders the metal film from extending along the semiconductor insulating portion toward the inner face. The semiconductor insulating portion can terminates the metal film thereon to hinder the metal film from extending beyond the semiconductor insulating portion to the first electrode. This termination reduces the occurrence of short circuit between the metal film and the first electrode. This reduction can prevent failures due to the short circuit from occurring in the quantum cascade laser.

In the quantum cascade laser according to an embodiment, the semiconductor insulating portion extends along the laminate end face. The insulating portion extends along the laminate end face and the rear end face allows the quantum cascade laser to have a large electrical resistance in the vicinity of the rear end face. Providing the vicinity of the rear end face with the large electrical resistance can reduce a leakage current, thereby improving the device performances (the reduction in the leakage current). Further, in the quantum cascade laser according to an embodiment, the semiconductor insulating portion is in contact with the metal film. The semiconductor insulating portion and the metal film that make contact with each other can provides the quantum cascade laser with an excellent heat dissipation path with no insulator thereon, so that the quantum cascade laser has an excellent device performance and a high reliability. Furthermore, the semiconductor insulating portion may extend along the laminate end face to isolate the metal film from the laminate end face.

The quantum cascade laser according to an embodiment further includes an insulating film, and the insulating film is between the laminate end face and the metal film. The insulating film can prevent the metal film from making contact with the laminate end face, thereby avoiding a short circuit to reduce the occurrence of failures resulting from the short circuit. In the quantum cascade laser according to an embodiment, the insulating film includes at least one of $SiO_2$, SiON, SiN, alumina, a BCB resin, or a polyimide resin. These materials can provide the insulating film of the quantum cascade semiconductor laser with an excellent durability and an insulating property, and allows the insulating film to work as a protective film for the laminate end face and the substrate end face. Films of the above materials can be formed on the laminate end face and the substrate end face using a dielectric film deposition, such as sputtering, CVD or spin coating. The formation of the insulating film can be introduced into the process for fabricating a quantum cascade semiconductor laser.

In the quantum cascade laser according to an embodiment, the semiconductor insulating portion includes semi-insulating semiconductor containing a transition metal as a dopant. In addition, in the quantum cascade laser according to an embodiment, the semiconductor device portion includes a current blocking portion embedding the semiconductor laminate; the current blocking portion includes at least one of semi-insulating or undoped semiconductor; and the semiconductor insulating portion is made of the same material as that of the current blocking portion. Growing the current blocking portion and the semiconductor insulating portion simultaneously makes the fabricating processes simplified. This simplification also makes the fabricating processes easy, resulting in an improved yield.

In the quantum cascade laser according to an embodiment, the semiconductor insulating portion, the semiconductor laminate, and the substrate may be arranged along the reference plane, e.g., the rear end face. Further, in the quantum cascade laser according to an embodiment, the semiconductor insulating portion is in direct contact with the substrate. Furthermore, in the quantum cascade laser according to an embodiment, the semiconductor laminate may be disposed between the semiconductor insulating portion and the substrate.

In the quantum cascade laser according to an embodiment, the semiconductor insulating portion includes semiconductor, such as III-V compound semiconductor, doped with a transition metal including at least one of Fe, Ti, Cr, and Co (dopant). The III-V compound semiconductor doped with the transition metal has a specific resistance of, for example, $10^5$ Ωcm or more to electrons, which is sufficiently high electric resistance.

In the quantum cascade laser according to an embodiment, the metal film includes an Au film. Using the Au film as the reflective film can provide the quantum cascade semiconductor laser with a high reflectance exceeding, for example, 90 percent at the laminate end face and the substrate end face.

In the quantum cascade laser according to an embodiment, the cladding layer includes InP. InP is transparent (no absorption of light) to lasing light in the mid-infrared wavelengths, and can be suitable as material of a cladding layer. InP is a binary mixed crystal, which is lattice-matched to an InP base, which allows the satisfactory crystal-growth of the InP layer on the InP substrate. InP has an excellent thermal conductivity, and allows the cladding layer to dissipate heat from the core layer. Using InP for the cladding layer can provide the quantum cascade laser with excellent temperature characteristics.

The quantum cascade laser according to an embodiment, the semiconductor substrate includes an InP base. The quantum cascade semiconductor laser capable of producing light in mid-infrared wavelengths has a semiconductor laminate of lattice constants close to that of InP. Using an InP base as the semiconductor substrate allows the growth of the semiconductor laminate on the semiconductor substrate with excellent crystal quality. Further, the semiconductor substrate of InP, which is transparent to mid-infrared light, can function as a cladding layer.

Teachings of the present invention can be readily understood by considering the following detailed description with reference to the accompanying drawings shown as examples. Referring to the accompanying drawings, embodiments of a quantum cascade laser, and a method for fabricating a quantum cascade laser according to the present invention will be described below. To facilitate understanding, identical reference numerals are used, where possible, to designate identical elements that are common to the figures.

FIG. 1 is a perspective view showing a quantum cascade laser 1 according to an embodiment. For easy understanding, an XYZ coordinate system is depicted in FIG. 1, and in the present embodiment X-, Y-, and Z-axes are orthogonal to each other. The quantum cascade laser 1 may have a distributed feedback type (DFB), which allows the quantum cascade laser 1 to lase in a single mode, for example, in a mid-infrared wavelength region of 3 to 20 micrometers. As shown in FIG. 1, the quantum cascade laser 1 is mounted on a submount 3, which is located on a carrier 2, with a solder material 4. Specifically, the quantum cascade laser 1 is die-bonded to the submount 3 with the solder material 4 in an epi-up manner (with the epi-surface upward). The quantum cascade laser 1 has a lower electrode, which is electrically connected to the carrier 2 with the submount 3 and the solder material 4, and has an upper electrode, which is connected to an end of a wiring conductor 5 reaching a bonding pad to feed power to the quantum cascade laser 1. The upper electrode of the quantum cascade laser 1 is electrically connected to the pad electrode on the submount through the wiring conductor 5. The carrier 2 and the pad electrode are electrically connected to an external power supply. The application of a voltage from the external power supply between the upper and lower electrodes of the quantum cascade laser 1 turns on the quantum cascade laser 1 to cause current to flow into the quantum cascade laser 1, so that the quantum cascade laser 1 emits lasing light.

The carrier 2 has a width W1 in a range of, for example, 4 to 8 mm in the X direction; a length L1 in a range of, for example, 4 to 8 mm in the Y direction; and a thickness H1 in a range of, for example, 1 to 8 mm in the Z direction. The submount 3 has a length W2 in a range of, for example, 1 to 4 mm in the X direction and a length L2 in a range of, for example, 2 to 4 mm in the Y direction, and has a thickness H2 in a range of, for example, 0.1 to 0.5 mm in the Z direction. The submount 3 may include AlN or CuW, and the carrier 2 may include Cu or CuW. The solder material 4 may include AuSn, indium (In) or silver paste, and the wiring conductor 5 may include Au.

Figure 2:
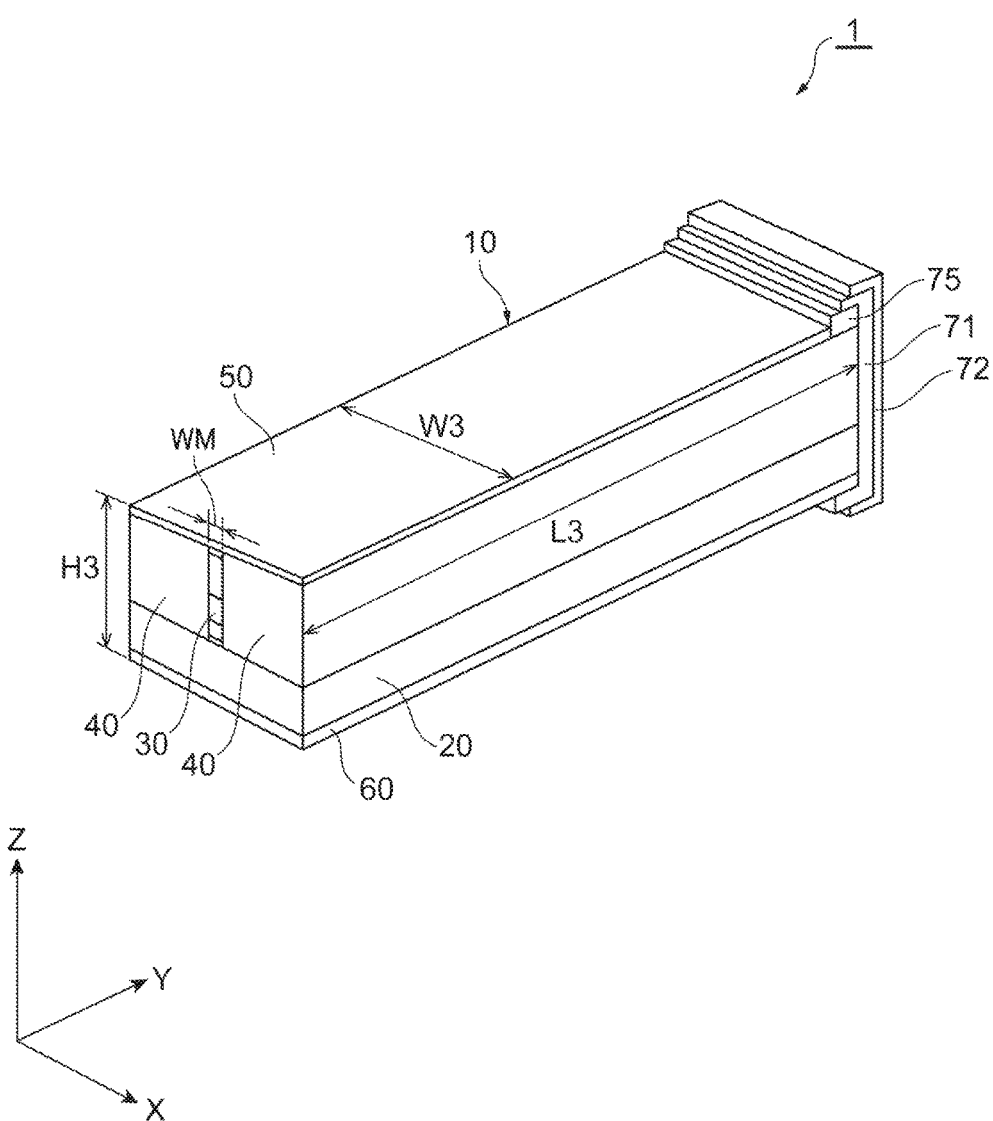
FIG. 2 is an enlarged perspective view showing the quantum cascade semiconductor laser as shown in FIG. 1.
Figure 3:
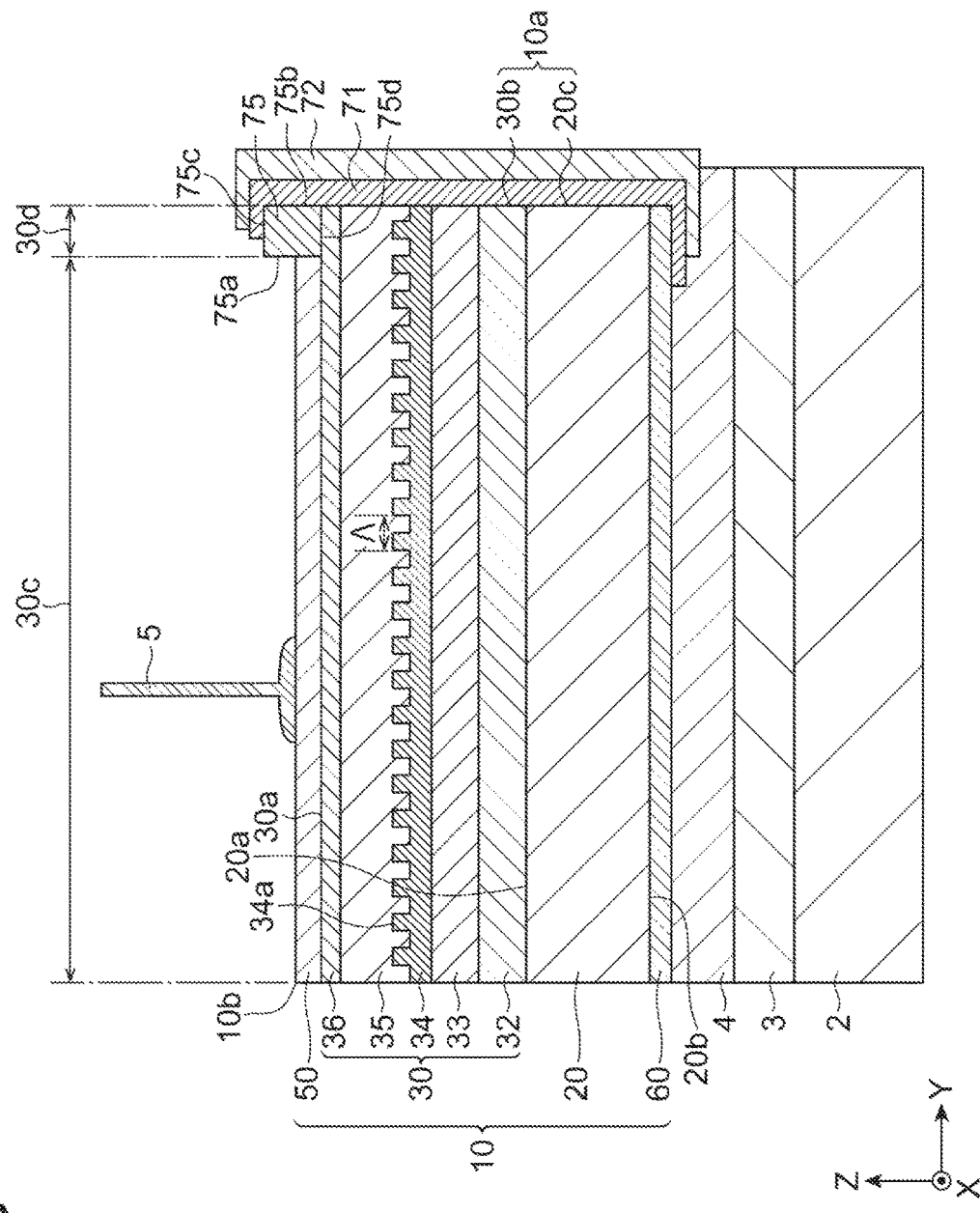
FIG. 3 is a cross-sectional view taken along line III-III shown in FIG. 1.

FIG. 2 is a perspective view showing the quantum cascade laser 1 shown in FIG. 1. FIG. 3 is a cross-sectional view taken along line III-III shown in FIG. 1 and a plane parallel to the YZ plane. As shown in FIGS. 2 and 3, the quantum cascade laser 1 includes a semiconductor device portion 10, an upper electrode 50 (referred to as a first electrode), a lower electrode 60 (referred to as a second electrode), and a metal film 72. The semiconductor device portion 10 includes a semiconductor substrate 20, a semiconductor laminate 30, and a semiconductor insulating film (referred to as a semiconductor insulating portion 75), and further include two current block portions 40. If needed, the quantum cascade laser 1 further includes an insulating film 71. The semiconductor device portion 10 has a buried-heterostructure (BH) enabling confinement of current, which is referred to as a current confinement structure. The semiconductor device portion 10 has a strip-shaped mesa, extending in a direction in which the waveguide mesa extends (e.g., in the Y direction). The semiconductor device portion 10 has a length L3 in a range of, for example, 1 to 3 mm in the Y direction; a length W3 in a range of, for example, 400 to 800 micrometers in the X direction; and a length H3 (the thickness of the semiconductor device portion 10) in a range of, for example, 100 to 200 micrometers. The semiconductor device portion 10 has a rear end face 10a and a front end face 10b, which are opposite to each other in the Y direction.

As shown in FIG. 3, the quantum cascade laser 1 is mounted on the submount 3 such that the semiconductor substrate 20 is bonded thereto with the solder material 4. The semiconductor substrate 20 may be, for example, an n-type InP base. The semiconductor substrate 20 is conductive to allow current to flow through the semiconductor laminate 30 in applying a voltage between the upper and lower electrodes 50 and 60. In order to allow the quantum cascade laser 1 to use electrons as carriers, the semiconductor substrate 20 has an n-type conductivity. The semiconductor substrate 20 can work as a lower cladding region with respect to the core layer 33. Alternatively, the quantum cascade laser can have a lower cladding layer between the semiconductor substrate 20 and the core layer 33, and the semiconductor substrate 20 may not work as a lower cladding region. The semiconductor substrate 20 includes a principal surface 20a, a back surface 20b, and a substrate end face 20c. The principal and back surfaces 20a and 20b are opposite to each other (in the Z direction). The principal surface 20a and the back surface 20b of the semiconductor substrate 20, and the submount 3 are arranged in order, for example, in the Z direction. The semiconductor substrate 20 has a thickness of, for example, 100 micrometers in the Z direction (defined as a distance between the principal and back surfaces 20a and 20b). The substrate end face 20c intersects an axis extending, for example, in the Y direction (the second direction), and connects the principal and back surfaces 20a and 20b. The substrate end face 20c is included by the rear end face 10a.

The semiconductor laminate 30 is disposed on the principal surface 20a of the semiconductor substrate 20. The semiconductor laminate 30 has an upper face 30a intersecting a direction of an axis, extending, for example, in the Z direction, a laminate end face 30b intersecting a direction of an axis extending, for example, in the Y direction, and a bottom face, which is in contact with the principal surface 20a and is opposite to the upper face 30a. The upper face 30a has a first area 30c and a second area 30d, which is disposed between the laminate end face 30b and the second area 30d. The first area 30c is disposed between the front end face 10b and the second area 30d, and the first and second areas 30c and 30d are arranged in a direction from the front end face 10b to the rear end face 10a, for example, the Y direction. The first and second areas 30c and 30d extend from the front end face 10b and the rear end face 10a, respectively, and adjoin to each other. The laminate end face 30b and the substrate end face 20c are arranged along a reference plane. The rear end face 10a includes the end face 30b of the semiconductor laminate 30 in addition to the substrate end face 20c. The semiconductor laminate 30 has a mesa shape. The semiconductor laminate 30 has a strip-shape extending, for example, in the Y direction, and a width WM defined in the X direction, and is located apart from the sides of the quantum cascade laser 1 in the X direction. The semiconductor laminate 30 includes end faces, which are opposite to each other in the Y direction, and side faces, which are opposite to each other in the X direction. The semiconductor laminate 30 is provided with end faces for the laser cavity, serving as mirrors, of the quantum cascade laser 1. One of the end faces is included in the laminate end face 30b. The semiconductor laminate 30 includes a buffer layer 32, a core layer 33, a diffraction grating layer 34, an upper cladding layer 35, and a contact layer 36, which are sequentially arranged on the semiconductor substrate 20.

As seen from the above description, the quantum cascade laser 1 is provided with the semiconductor device portion 10 including the substrate 20, the semiconductor laminate 30, and the semiconductor insulating portion 75. The substrate 20 and the semiconductor laminate 30 are arranged in a first direction, for example the Z direction. The semiconductor laminate 30 is disposed on the substrate 20. The semiconductor laminate 30 has a principal surface 30a, and the substrate 29 has a back surface 20b. The principal surface 30a and the back surface are arranged in the first direction. The principal surface 30a is opposite to the back surface 20b. The substrate 20 has a substrate end face 20c, and the semiconductor laminate 30 has a laminate end face 30b. The semiconductor insulating portion 75 and the substrate 20 are disposed along a reference plane intersecting the second direction. The semiconductor device portion 75 is provided with the rear end face 10a and the front end face 10b, which are arranged in the second direction. The rear end face 10a includes the substrate end face 20c extending along the above reference plane. The metal film 72 is disposed on the rear end face 10a, the semiconductor insulating portion 75 and the second electrode 60. The substrate end face 20c extends along the reference plane, and the metal film 72 is apart from the first electrode 50.

The principal surface 30a of the semiconductor laminate 30 is provided with the first and second areas 30c and 30d, which are arranged in the second direction. The semiconductor insulating portion 75 is disposed on the second area 30c. The first electrode 50 has an end apart from the laminate end face 30b and on the second area 30d.

The semiconductor insulating portion 75 is provided with an inner side face 75a and an outer side face 75b. The outer side face 75b and the substrate end face 20c are arranged along the reference plane. The inner side face 75a may be inclined with the principal surface 30a.

The semiconductor insulating portion 75 extends along the semiconductor laminate end face 30b.

The semiconductor insulating portion 75 may be in contact with the metal film 72.

The insulating film 71 may be between the laminate end face 30b and the metal film 72.

The semiconductor insulating portion 75, the semiconductor laminate 30, and the substrate 20 are arranged along the reference plane.

The semiconductor insulating portion 75 may be in direct contact with the substrate 20. Alternatively, the semiconductor laminate 30 may be between the semiconductor insulating portion 75 and the substrate 20.

The buffer layer 32 and the upper cladding layer 35 can be made of, for example, n-type InP. The buffer layer 32 works along with the semiconductor substrate 20 to provide a lower cladding region for the core layer 33. The upper cladding layer 35 is disposed on the core layer 33 and the diffraction grating layer 34, which is between the core layer and the upper cladding layer. If needed, the semiconductor laminate 30 uses the buffer layer 32, and the core layer 33 is disposed directly on the principal surface 20a of the semiconductor substrate 20. The core layer 33 extends from the laminate end face 30b along a direction of an axis extending in the Y direction. The core layer 33 includes multiple unit structures. The unit structures are arranged in the direction of an axis along which the core layer and the upper cladding layer are arranged (along the Z direction), thereby forming an array, and the adjacent unit structures in the array are in contact with each other. The array may include, for example, several tens of unit structures. The unit structures each include quantum well layers (several-nanometer thick) and barrier layers (several-nanometer thick), which are alternately arranged to form a superlattice, for example, in the Z direction. The quantum well layers each can include GaInAs or GaInAsP, and the barrier layers each can include AlInAs. Each unit structure is composed of an active layer and an injection layer. The active layers each work as a light emitting region to emit light. The injection layers each can deliver carriers into the adjacent active layer. The active layers and the injection layers are stacked along the Z direction to form a superlattice made of GaInAs/AlInAs.

The mechanism of optical emission of the quantum cascade laser 1 will be briefly described. The quantum cascade laser 1 uses a single kind of carriers, such as electrons, to emit light caused by optical transition of electrons between subbands of the conduction band in the active layers. The light produced by the emission is amplified in the lasing cavity of the quantum cascade laser 1, whereby the quantum cascade laser 1 emits laser light in a mid-infrared wavelength region. Specifically, the quantum cascade laser 1 has the following three-level system in the conduction band in the active layer. First, an injection layer injects electrons into the upper level of the active layer by tunneling. These electrons transition from the upper to lower levels of the active layer. This transition creates light having a wavelength of energy equal to its transition energy (the energy difference between the upper and lower levels of the subbands). The electrons in the lower level further makes a non-radiative transition to the bottom level in a short relaxation time by use of LO phonon scattering. As seen from the above description, the energy difference between the lower and bottom levels is designed to allow LO phonons to resonantly scatter the electrons. The non-radiative transition of electrons to the bottom level in a short relaxation time produces an inverted population of electrons between the upper and lower levels in the active layer. The electrons thus relaxed to the bottom level drift to the upper level of the active layer in the next stage by an electric field through the injection layer therebetween. Subsequently, the core layer in the quantum cascade laser 1 repeats the same transitions and deliveries by, for example, several tens of times in the core layer to obtain a gain necessary for lasing. The quantum cascade laser 1 uses the quantum well layers and the barrier layers with their thicknesses and material compositions appropriately selected to allow the adjustment of the energy difference between the upper and lower levels for lasing in the infrared region, for example, in the range of 3 to 20 micrometers.

As shown in FIG. 3, the diffraction grating layer 34 has a diffraction grating 34a with a periodic surface structure of a period Λ, which has recesses and ridges alternately arranged in the Y direction. The diffraction grating 34a is formed as follows: forming a patterned resist of a period Λ on a film for the diffraction grating layer 34; and etching the film for the diffraction grating layer 34 with the patterned resist to form recesses and ridges, periodically arranged in the Z direction, for the diffraction grating. The diffraction grating of the period Λ can selectively reflect light of a wavelength equivalent to the period Λ, i.e., the Bragg wavelength, and the light thus reflected selectively is amplified by the lasing cavity, leading to lasing in the quantum cascade laser 1 in a single mode at the Bragg wavelength. The performance of the diffraction grating layer 34 is represented by a coupling coefficient indicating the magnitude of coupling between guided light components going forward and backward in the lasing cavity. The diffraction grating 34a with a large coupling coefficient allows the quantum cascade laser 1 to satisfactorily produce a single-mode laser beam. The diffraction grating layer 34 is provided with semiconductor having a high refractive index, such as undoped or n-type GaInAs, to enable a large coupling coefficient.

If needed, the semiconductor laminate 30 includes the contact layer 36, and otherwise a contact between the upper cladding layer 35 and the upper electrode 50 can provide a good ohmic contact. The contact layer 36 makes good ohmic contact with the upper electrode 50. The contact layer 36 is made of material having a small bandgap and lattice-matched to the semiconductor substrate 20 to enable good ohmic contact. The contact layer 36 is made of, for example, n-type GaInAs.

As shown in FIG. 2, the semiconductor laminate 30 is embedded by the two current blocking portions 40 on both side faces thereof, and the current blocking portions 40 function as a current confinement layer constricting current (carriers) in the semiconductor laminate 30. The two current block portions 40 are disposed on the principal surface 20a of the semiconductor substrate 20 to cover both side faces of the semiconductor laminate 30. Each current block portion 40 includes undoped or semi-insulating semiconductor. These undoped and semi-insulating semiconductors have high electrical resistance, which are used for material of the current block portion 40, to carriers, such as electrons. The addition of a transition metal, such as Fe, Ti, Cr, and Co (dopant), to III-V compound semiconductor forms deep levels, which can trap electrons, in the forbidden band to provide host semiconductor with a semi-insulating property. The III-V compound semiconductor doped with the transition metal has a specific resistance of, for example, $10^5$ Ωcm or more to electrons, which is sufficiently high electric. Iron (Fe) is an excellent transition metal to enable the semi-insulating property. An undoped semiconductor with a sufficiently high electric resistance to electrons can be used for the current block portions 40. Undoped or semi-insulating III-V compound semiconductor encompasses InP, GaInAs, AlInAs, GaInAsP, and/or AlGaInAs. These semiconductors are lattice matched to the semiconductor substrate 20, and are grown thereon by a growth method, such as molecular beam epitaxy (MBE) and metalorganic vapor phase epitaxy (OMVPE).

The upper and lower electrodes 50 and 60 are arranged to supply current to the core layer 33. The upper and lower electrodes 50 and 60 each include, for example, Ti/Au, Ti/Pt/Au, or Au/Ge. The upper electrode 50 works as, for example, a cathode electrode, and is disposed on the upper face 30a of the semiconductor laminate 30 (specifically, on the contact layer 36) and the current block portions 40. More specifically, the upper electrode 50 is located on the first area 30c, and is apart from the second area 30d. The lower electrode 60 works as, for example, an anode electrode, and is disposed on the back face 20b of the semiconductor substrate 20 and is in contact with the solder material 4. The lower electrode 60 is applied to a positive potential with respect to the upper electrode 50.

If needed, an optical confinement layer may be disposed between the core layer 33 and the semiconductor substrate 20 and/or between the core layer 33 and the upper cladding layer 35. The optical confinement layer has a bandgap smaller than the bandgaps of the semiconductor substrate 20 and the upper cladding layer 35, and larger than that of the core layer 33. The optical confinement layer efficiently injects electrons from the buffer layer 32 to the core layer 33 therethrough without blocking them. This magnitude relationship in these bandgaps allows the optical confinement layer to have a refractive index larger than refractive indices of the semiconductor substrate 20 and the upper cladding layer 35, and smaller than that of the core layer 33. The semiconductor substrate 20 and the upper cladding layer 35, therefore, work to confine light, which is produced by the core layer 33, into the core layer 33 and the optical confinement layer, thereby enhancing the confinement of light into the core layer 33. In order to enhance confinement of light into the core layer 33, the optical confinement layer can be made of material that has a refractive index higher than the refractive indices of the semiconductor substrate 20 and the upper cladding layer 35 and is lattice matched to the semiconductor substrate 20. The optical confinement layer may include, for example, undoped or n-type GaInAs.

The insulating film 71 is located adjacent to the rear end face 10a of the semiconductor device portion 10, and is disposed between the metal film 72 and the laminate and substrate end faces 30b and 20c. Specifically, the insulating film 71 has a thick portion on the rear end face 10a (the laminate and substrate end faces 30b and 20c), and upper and lower thin portions which extend from the thick portion along the second area 30d and the lower electrode 60. More specifically, the laminate end face 30b and the substrate end face 20c are entirely covered with the thick portion of the insulating film 71, and the lower electrode 60 have end portions, which are covered with the thin lower portion of the insulating film 71, close to the rear end face 10a. The thick portion of the insulating film 71 has a thickness, which is measured in the Y direction, on the rear face 10a larger than that of the upper portion of the insulating film 71, which is measured in the Z direction, on the second area 30d and that of the lower portion of the insulating film 71, which is measured in the Z direction, on the lower electrode 60. For example, the thickness of the insulating film 71 on the rear face 10a is in a range of 100 to 200 nm, and the thicknesses of the insulating film 71 on the upper and lower electrodes 50 and 60 in the Z direction each are in a range of 20 to 30 nm. The insulating film 71 is made of dielectric film including at least one of $SiO_2$, SiON, SiN, $Al_2O_3$ (alumina), BCB resin, or polyimide resin. The metal film 72 is disposed on the laminate and substrate end faces 30b and 20c and the insulating film 71, which is on the second area 30d and the lower electrode 60. The insulating film 71 is between the metal film 72 and the lower electrode 60. Specifically, the metal film 72 has a thick portion on the rear end face 10a (the laminate and substrate end faces 30b and 20c), and upper and lower thin portions which extend from the thick portion along the second area 30d and the lower electrode 60, respectively. More specifically, the laminate end face 30b and the substrate end face 20c are entirely covered with the thick portion of the metal film 72, and the lower electrode 60 has a first portion, which is covered with the lower thin portion of the metal film 72, close to the rear end face 10a, and a second portion, which is not covered with the metal film 72, far from the rear end face 10a. The thick portion of the insulating film 71 has a thickness, which is defined as a thickness in the Y direction, on the rear face 10a larger than that of the upper portion of the insulating film 71, which is defined as a thickness in the Z direction, on the second area 30d and that of the lower portion of the insulating film 71, which is defined as a thickness in the Z direction, on the lower electrode 60. The metal film 72 may include gold (Au), which has a high reflectance of 90 percent or more. The solder material 4 is disposed on the submount 3 so as to reach the lower edge of the substrate end face 20c, so that the metal film 72 on the lower electrode 60 makes contact with the solder material 4. Alternatively, the metal film 72, which covers the substrate end face 20c, may not be disposed on the lower electrode 60, and is provided with the lower edge on the substrate end face 20c, resulting in that the lower edge makes contact with the solder material 4. Such a metal film 72, which ends on the rear end face 10a, can be formed by use of a long protector 90 that can cover the lower electrode and the rear end face 10a in a later step for depositing the metal film 72.

The semiconductor insulating portion 75 has a rectangular parallelepiped shape extending along the X direction. The semiconductor insulating portion 75 is provided on the second area 30d and is disposed between the upper electrode 50 and the metal film 72 in the Y direction. Specifically, the semiconductor insulating portion 75 is disposed between the upper electrode 50 and the insulating and metal films 71 and 72 in the Y direction, and is disposed between the second area 30d and the insulating and metal films 71 and 72 in the Z direction. The semiconductor insulating portion 75 is provided with the inner side face 75a and the outer side face 75b, and further includes an upper face 75c and a lower face 75d. The inner and outer side faces 75a and 75b intersect an axis extending the Y direction. The inner side face 75a extends along one reference plane parallel to the rear end face 10a, and the outer side face 75a and the rear end face 10a extend along another reference plane. In the present example, the side faces 75a and 75b intersect an axis extending in the Y direction. The side face 75a faces the upper electrode 50 in the Y direction. The side face 75b is on the opposite side of the side face 75a in the Y direction. The side face 75b is entirely covered with the insulating film 71. The upper face 75c and the lower face 75d intersect an axis extending in the Z direction. In one example, the side faces 75a and 75b are orthogonal to the axis extending in the Y direction. The insulating film 71 is in contact with the upper face 75c. The insulating and metal films 71 and 72 have respective edges on the upper face 75c. The insulating and metal films 71 and 72 both extend from the laminate end face 30b to the upper face 75c. The upper face 75c has a level higher than the second area 30d of the principal surface 30a with respect to the principal surface 20a of the semiconductor substrate 20 in the Z direction. The upper face 75c is on the second area 30d apart from the upper electrode 50 in the Z direction. The lower face 75d is on the opposite side of the upper face 75c in the Z direction on the second area 30d.

The semiconductor insulating portion 75 has a thickness of, for example, 1 to 2 micrometers (which is the distance in the Z direction between the upper and lower faces 75c and 75d) in the Z direction, and, for example, 1.5 to 2 micrometers. The semiconductor insulating portion 75 has a width (the distance between the side faces 75a and 75b) larger than, for example, 10 micrometers or more in the Y direction in order to avoid the occurrence of deterioration in crystal growth, such as an abnormal crystal growth. The semiconductor insulating portion 75 has a width of, for example, 70 micrometers less in the Y direction, to provide the upper face 75c of the semiconductor insulating portion 75 with an excellent flatness. The semiconductor insulating portion 75 is made of the same material as that of the current blocking portion 37, which can include undoped or semi-insulating semiconductor. The semi-insulating property of semiconductors can provided by III-V compound semiconductor doped with a transition metal, such as Fe, Ti, Cr and Co, to form deep levels in the forbidden band which trap electrons. For example, the undoped or semi-insulating III-V compound semiconductor includes InP, GaInAs, AlInAs, GaInAsP, and AlGaInAs.

Figure 4A:
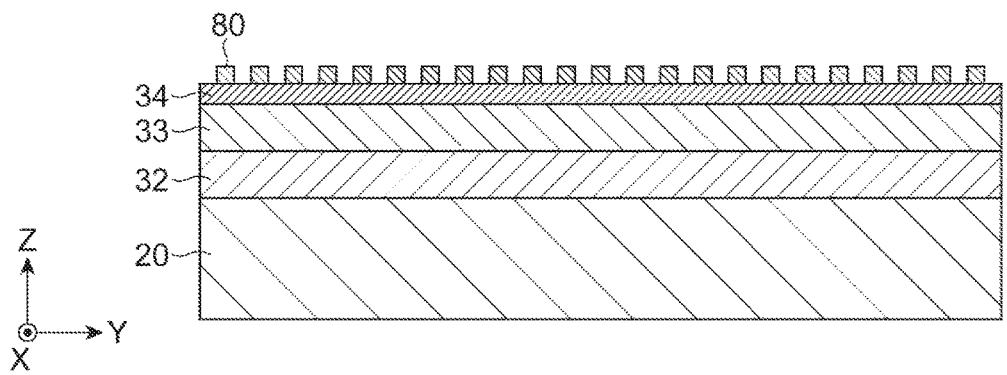
FIG. 4A is a schematic view showing a major process in the method for fabricating a quantum cascade semiconductor laser, shown in FIG. 1, according to the embodiment.
Figure 4B:
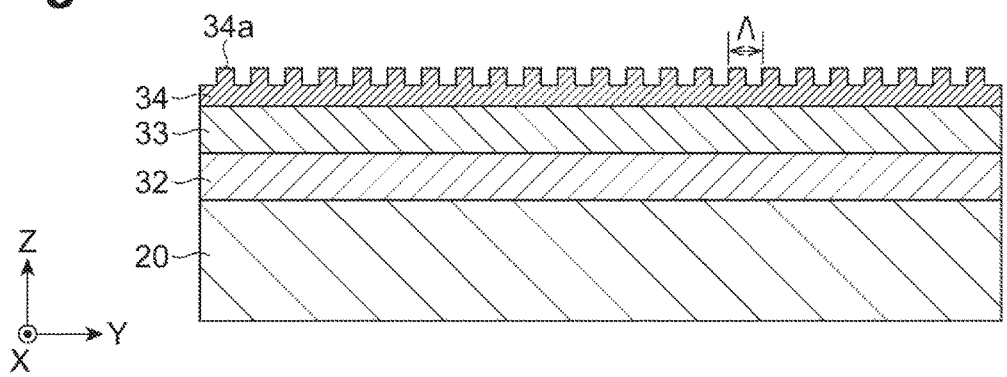
FIG. 4B is a schematic view showing a major process in the method according to the embodiment.

A description will be given of the method for fabricating the quantum cascade laser 1 of the above structure. FIGS. 4A to 4C,
FIGS. 5A to 5C, FIGS. 6A and 6B, FIGS. 7A and 7B, FIGS. 8A and 8B, and FIG. 9 are schematic views each showing a major process in a method for fabricating the quantum cascade laser 1 shown in FIG. 1. FIGS. 4A to 4C, FIGS. 6A to 6C, and FIGS. 7A and 7B are cross sectional views each taken along a plane, which is associated with line III-III of FIG. 1, parallel to the YZ plane, and FIGS. 5A to 5C are cross sectional views each taken along a plane parallel to the YZ plane. First, a wafer is prepared which will be the semiconductor substrate 20 in a later process. Then, in a first crystal growth step, the buffer layer 32, the core layer 33, and the diffraction grating layer 34 are grown in order on the principal surface of the wafer by a growth method, such as MBE and OMVPE, to form an epi-wafer. Thereafter, a resist mask 80 is formed on the epi-wafer by photolithography on the diffraction grating layer 34. As shown in FIG. 4A, the resist mask 80 has a pattern for the diffraction grating 34a. The pattern of the resist mask 80 has a width of Λ in the X direction. The epi-wafer is etched with the resist mask 80 in the Z direction to form the diffraction grating 34a with a periodic structure, as shown in FIG. 4B, in the diffraction grating layer 34.

Figure 4C:
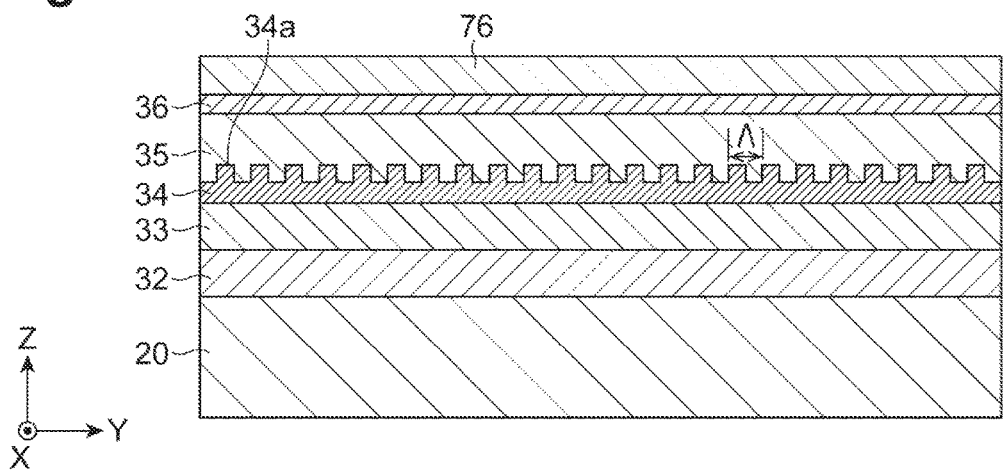
FIG. 4C is a schematic view showing a major process in the method according to the embodiment.
Figure 5A:
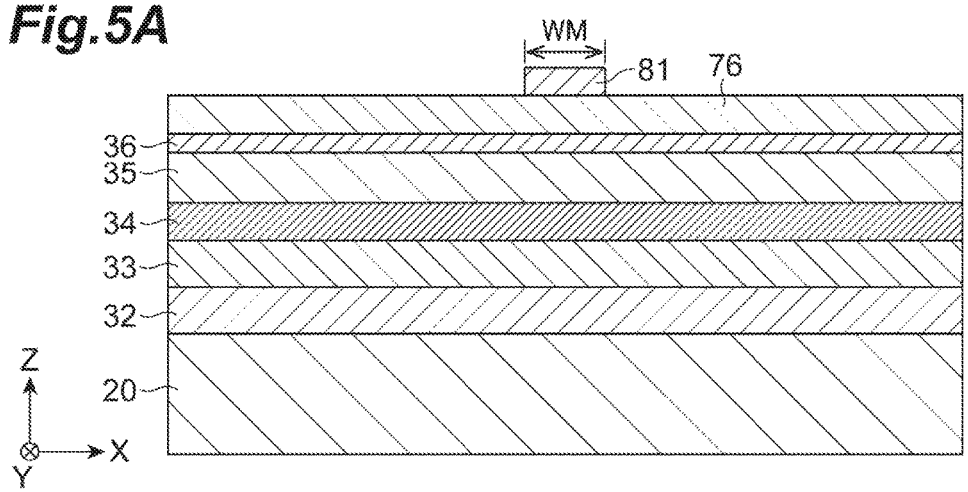
FIG. 5A is a schematic view showing a major process in the method according to the embodiment.
Figure 5B:
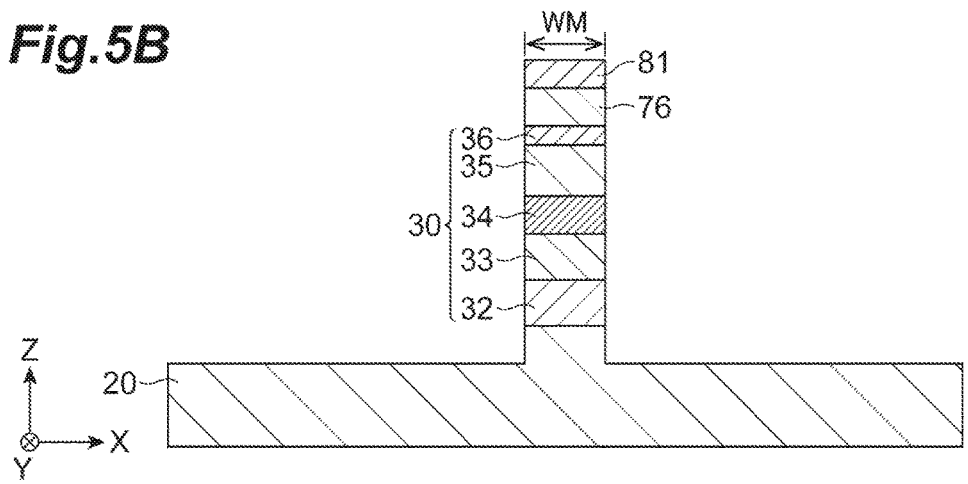
FIG. 5B is a schematic view showing a major process in the method according to the embodiment.
Figure 5C:
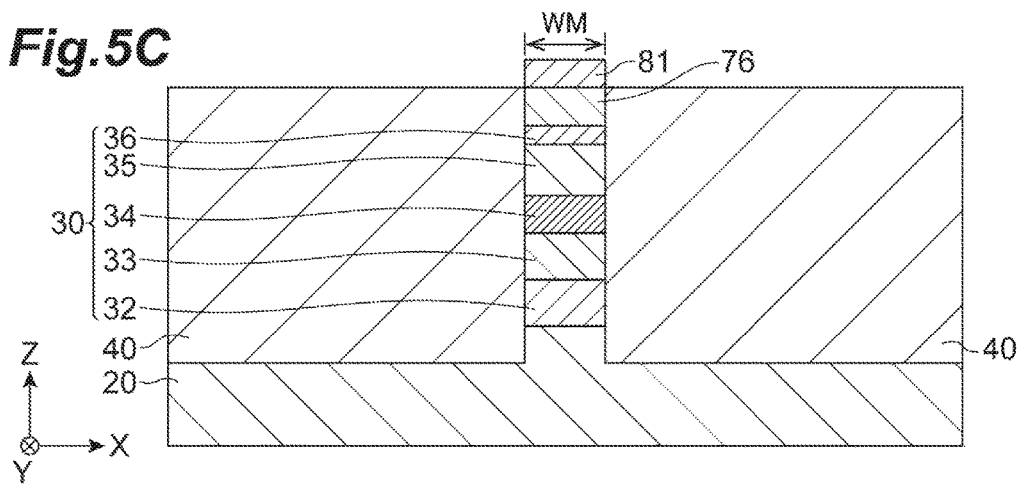
FIG. 5C is a schematic view showing a major process in the method according to the embodiment.

In a second crystal growth step, as shown in FIG. 4C, the upper cladding layer 35, the contact layer 36, and a semi-insulating semiconductor layer 76 for the semiconductor insulating portion 75 are grown in order on the diffraction grating layer 34 to form a laminate made of semiconductor films for semiconductor laminate 30. Next, as shown in FIG. 5A, a mask 81 defining the shape of the semiconductor laminate 30 is formed on the semiconductor films, specifically, the semi-insulating semiconductor layer 76 by photolithography. The mask 81 has a pattern, which has a width WM defined in the X direction, extending in the Y direction in each of device sections for the quantum cascade lasers 1 and is apart from the boundaries between the device sections in the X direction. The mask 81 may include the same material as that of the insulating film 71, and specifically, be mode of a dielectric material containing at least one of SiN, SiON, alumina, and $SiO_2$.

The application of an etching process to the semi-insulating semiconductor layer 76, the contact layer 36, the upper cladding layer 35, the diffraction grating layer 34, the core layer 33, the buffer layer 32, and the semiconductor substrate 20 with the mask 81 forms the semiconductor laminate 30, which has a mesa-shape as shown in FIG. 5B. The etching may include dry etching and/or wet etching, and in the present embodiment, the dry etching is used to form the semiconductor laminate 30. The dry etching can provide the semiconductor laminate layer 30 of the width WM with excellent verticality and high accuracy. The dry etching greatly affects the device characteristics of the quantum cascade laser 1. The dry etching may be, for example, reactive ion etching (RIE), and the reactive ion etching (RIE) uses plasma of etching gas.

Figure 6A:
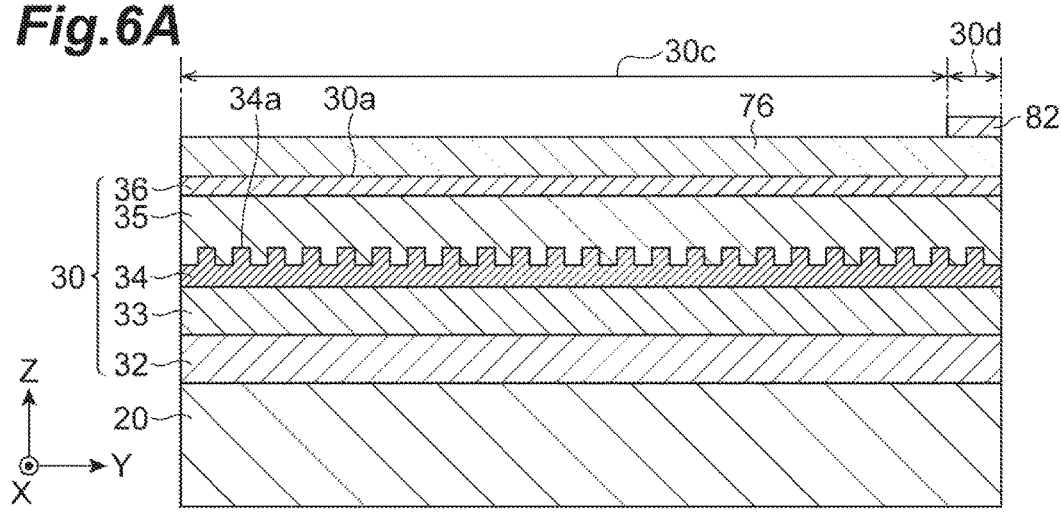
FIG. 6A is a schematic view showing a major process in the method according to the embodiment.

In a third crystal growth step, a semi-insulating semiconductor layer, such as InP doped with Fe, is grown with the mask 81 left on the semi-insulating portion 75. As shown in FIG. 5C, deposited material is hardly formed on the mask 81, and the semi-insulating semiconductor layer is grown on both sides of the semiconductor laminate 30 (grown between the semiconductor laminates formed in etching in FIG. 5B) so as to embed the semiconductor laminates 30. These two current block portions 40 are formed to embed the semiconductor laminate 30. After removing the mask 81, as shown in FIG. 6A, another mask 82 is formed on the semiconductor layer 76 on the second area 13d by photolithography. The other mask 82 is made of the same material as that of the mask 81. Etching the semiconductor layer 76 with the mask 82 forms a patterned semiconductor layer 76, which is under the pattern of the mask 82. The mask 82 is removed to obtain the semiconductor insulating portion 75.

Figure 6B:
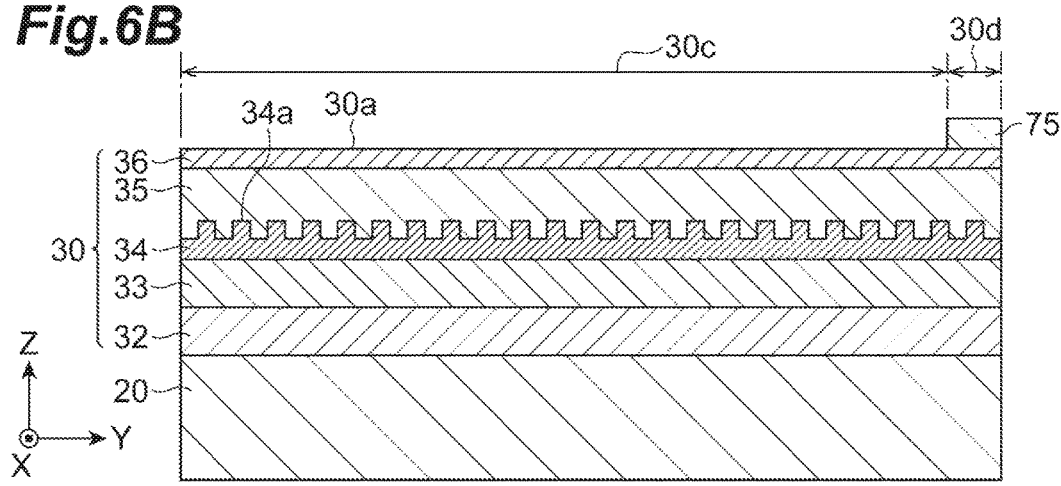
FIG. 6B is a schematic view showing a major process in the method according to the embodiment.
Figure 6C:
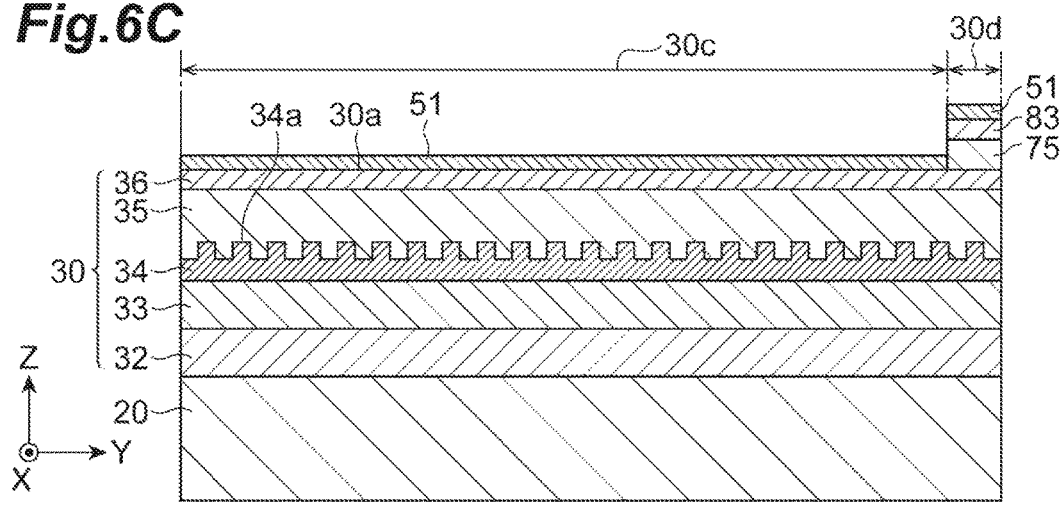
FIG. 6C is a schematic view showing a major process in the method according to the embodiment.
Figure 7A:
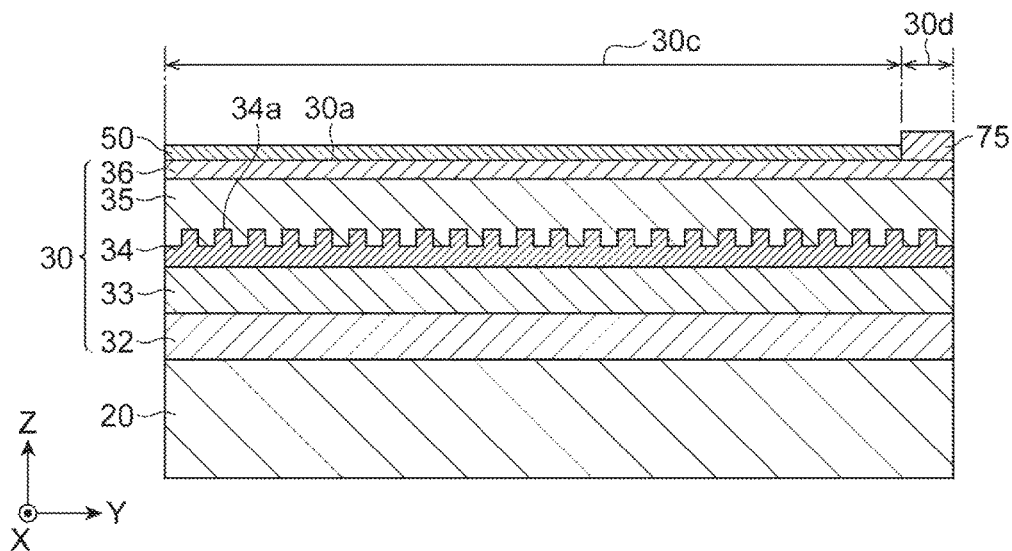
FIG. 7A is a schematic view showing a major process in the method according to the embodiment.
Figure 7B:
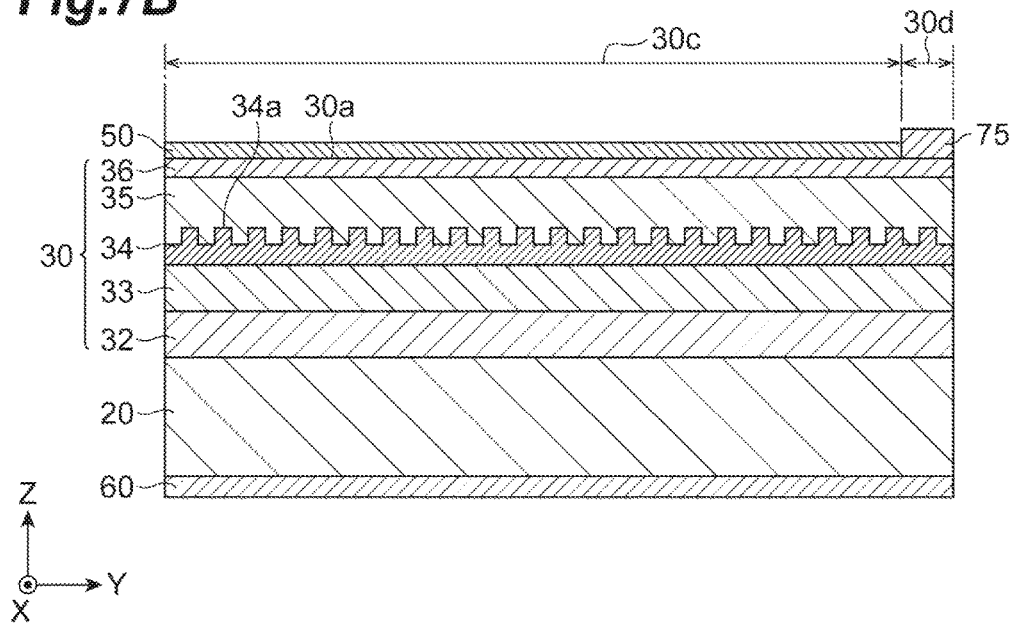
FIG. 7B is a schematic view showing a major process in the method according to the embodiment.

As shown in FIG. 6C, a resist mask 83, which is patterned by photolithography, is formed on the semiconductor insulating portion 75. A metal film 51 for the upper electrode 50 is deposited on the first area 30c and the resist mask 83. The application of lifting-off to the metal film 51 and deposited metal material on the resist mask simultaneously removes the resist mask 83 and the deposited metal material to form the patterned metal film 51, i.e., the upper electrode 60 as shown in FIG. 7A, on not the second area 30d but the first area 30c. After the upper electrode 60 has formed on the first area 30c, the wafer is thinned by polishing to a thickness to make the cleavage of the wafer (for example, 100 to 200 micrometers) easy, and then as shown in FIG. 7B, the lower electrode 60 is formed on the back face 20b of the thinned semiconductor substrate 20.

Figure 8A:
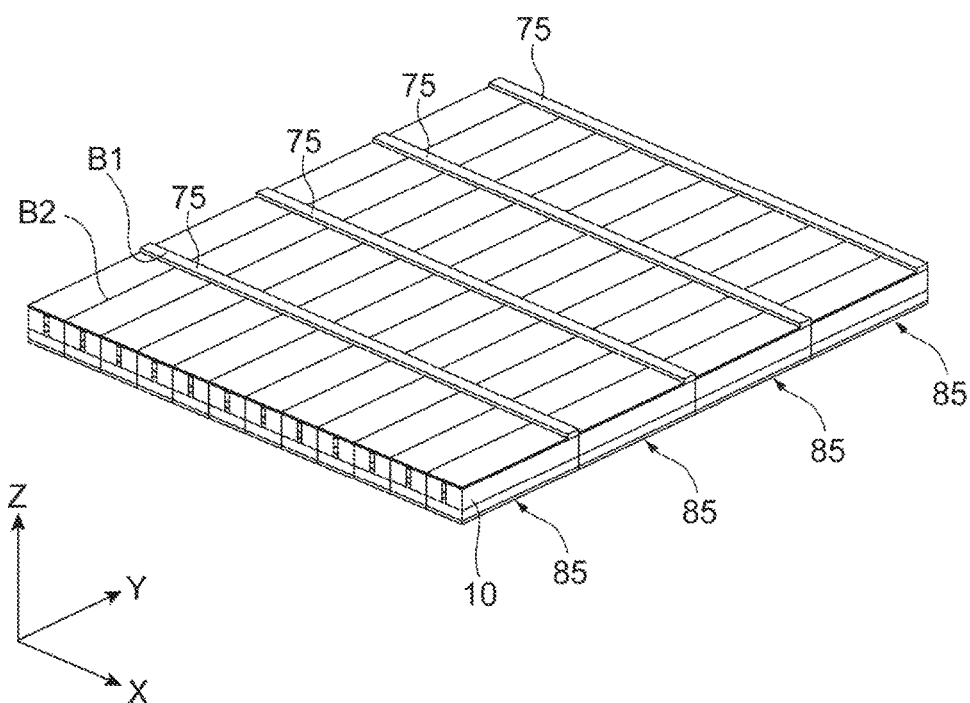
FIG. 8A is a schematic view showing a major process in the method according to the embodiment.
Figure 8B:
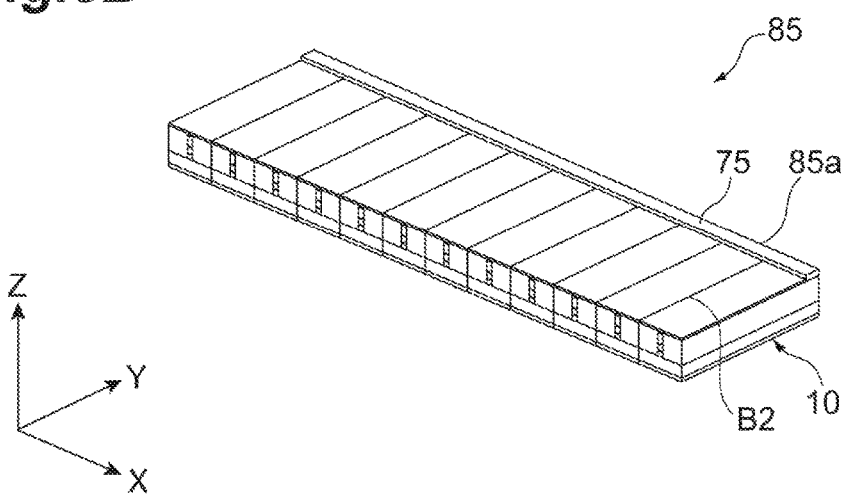
FIG. 8B is a schematic view showing a major process in the method according to the embodiment.

The above processes bring a wafer product to completion. FIG. 8A shows a wafer product having an array of device sections, which are arranged in the X and Y directions over the entire wafer, for the multiple semiconductor device portions 10 of the quantum cascade lasers 1. The device sections of the wafer product each include the semiconductor insulating portion 75. In FIG. 8A, boundary lines B1 and B2 between the device sections are depicted, and the wafer product are divided along the lines B1 and B2 to form the multiple semiconductor device portions 10. Specifically, the boundary lines B1 extend in the X direction, and the boundary lines B2 extend in the Y direction. Then, the wafer product is separated by cleavage at the boundary lines B1 into chip-bars each having the arrangement of the multiple device sections for the semiconductor device portions 10, e.g. a chip bar 85 as shown in FIG. 8B. The chip bar 85 includes the multiple semiconductor device sections, which are arranged along the X direction, having the semiconductor insulating portions 75 over the device sections. The chip bar 85 has an end face 85a including the rear end faces 10a of the quantum cascade lasers 1 arranged in the X direction. In the chip bar 85, the semiconductor insulating portion 75 extends on the upper face of the semiconductor device portions of the chip bar 85 along the end face 85a.

Figure 9:
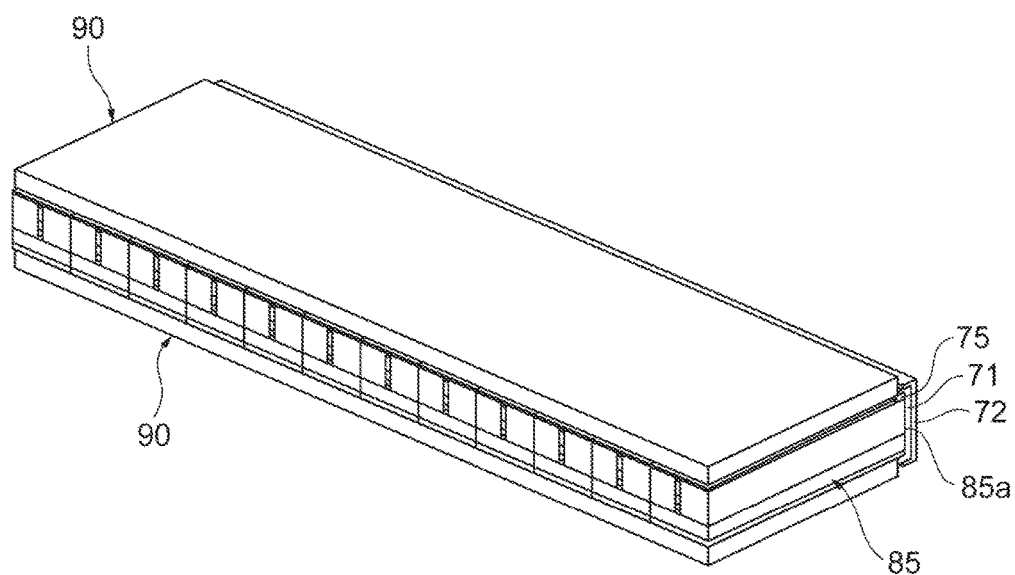
FIG. 9 is a perspective view showing a major process in a method for fabricating a quantum cascade semiconductor laser shown in FIG. 1, according to the embodiment.

A description will be given of a process of forming the insulating film 71 and the metal film 72 on the end face 85a of the chip bar 85. First, as shown in FIG. 9, two protectors 90 are prepared in order to form the insulating film 71 on an area of the chip bar 85, and this area includes the end face 85a of the chip bar 85. The protectors 90 each may have a thin plate of a rectangle, the longitudinal of which is oriented to the X direction as shown in FIG. 8A. One protector 90 is used to cover, except for the near zone of the upper electrode 50 close to the end face 85a of the chip bar 85, almost all the upper electrode 50, i.e., the far zone, and not to cover the end face 85a. The one protector 90 has an end, which is located at the boundary between the near and far zones of the upper electrode 50, and the near and far zones are arranged in the Y direction. The protector 90 is aligned with the semiconductor insulating portion 75 of the chip bar 85 to cover a part of the side face 75a of the semiconductor insulating portion 75 (shown in FIG. 3). Another protector 90 is used to cover, except for the near zone of the lower electrode 50 close to the end face 85a of the chip bar 85, almost all the lower electrode 60, i.e., the far zone, and not to cover the end face 85a. The other protector 90 has an end, which is located at the boundary between the near and far zones of the lower electrode 60, and the near and far zones are arranged in the Y direction. After attaching the protectors 90 to the chip bar, an insulating film 71 is formed on the end face 85a.

Specifically, flux containing constituent atoms for the insulating film 71 is supplied to the end face 85a, and the constituent atoms are deposited on the end face 85a, for example, by CVD or sputtering to form the film. The constituent atoms fly toward the end face 85a in the direction normal to the end face 85a. At this time, the constituent atoms that miss the end face 85a fly along both the semiconductor insulating portion 75 and the lower electrode 60, and are deposited on parts of the top face 75c and the lower electrode 60 that are included in the near zone of the chip bar 85, thereby forming the insulating film 71. The insulating film 71 is formed on the end face 85a and the near zone of the chip bar 85 to form a second wafer product. After forming the insulation film 71, the protectors 90 are detached from the chip bar.

A description will be given of a process of forming the metal film 72 on the end face 85a. After attaching the protectors 90 to the chip bar 85 that has the insulating film 71 thereon, the metal film 72 is formed on the insulating film 71 on the end face 85a. Electron beam evaporation is used to deposit constituent atoms for the metal film 72 on the end face 85a. At this time, the constituent atoms that miss the end face 85a fly along both the semiconductor insulating portion 75 and the lower electrode 60, and are deposited on parts of the top face 75c and the lower electrode 60 that are included in the near zones of the chip bar 85, thereby forming the insulating film 72. The metal film 72 is formed in the end face 85a and the near zone of the chip bar 85 to form another wafer product. Specifically, this evaporation can form the metal film 72 on the insulating film 71, which covers the upper electrode 50 in the near zone of the chip bar 85. The metal film 72 is formed on the semiconductor insulating portion 75, the end face 85a, and the near zone of the chip bar 85 on the lower electrode 60. After forming the metal film 72, the protectors 90 are detached from the chip-bar.

The protector 90 for forming the metal film 72 has a length in the Y direction longer than that of the protector 90 for forming the insulating film 71 in the Y direction. On the top face 75c, the edge of the metal film 72 is positioned closer to that of the insulating film 71 with respect to the end face 85a in the Y direction. After forming both the insulating film 71 and the metal film 72, the chip bar 85 thus formed is broken along the boundary lines B2 by cleavage (referring to FIG. 8B) into the quantum cascade lasers 1 as shown in FIG. 1.

A description will be given of advantageous effects of the quantum cascade laser 1 according to the above-described embodiment. A quantum cascade laser is a promising light source that can be used in technical fields, such as environmental gas analysis, medical diagnosis, and industrial processing. The quantum cascade laser produces a lasing light beam in mid-infrared wavelengths (for example, a wavelength range of 3 to 30 micrometers). Quantum cascade lasers can be light sources that offer a reduction in size and cost, and are now being developed. Particularly, in the field of gas sensing, which is promising in the mid-infrared wavelengths, single-mode DFB quantum cascade lasers in the mid-infrared become the mainstream of the development because they can provide light for use in detecting an absorption line of a specific gas. Such a quantum cascade laser incorporates, in principle, the occurrence of non-radiative recombination due to LO phonon scattering, which increase the threshold current of the lasing to several hundred of mA to several amperes, so that the quantum cascade laser consumes a large amount of power. The increase in the threshold current is one of the reasons to hinder the practical application of quantum cascade lasers. In order to suppress the increase in the threshold current, the quantum cascade laser can be provided with the lasing cavity that has a metal film on the end face thereof.

Figure 10:
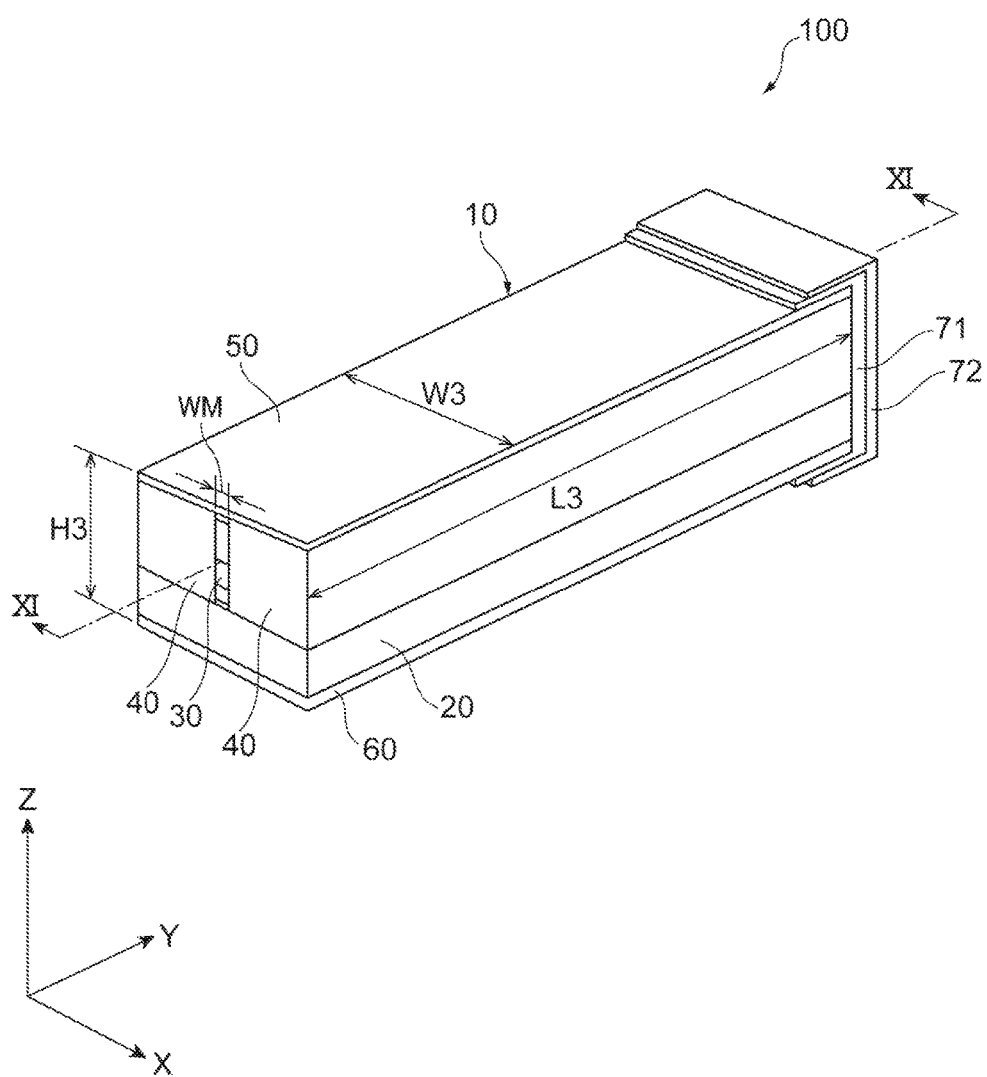
FIG. 10 is a perspective view showing a quantum cascade semiconductor laser.
Figure 11:
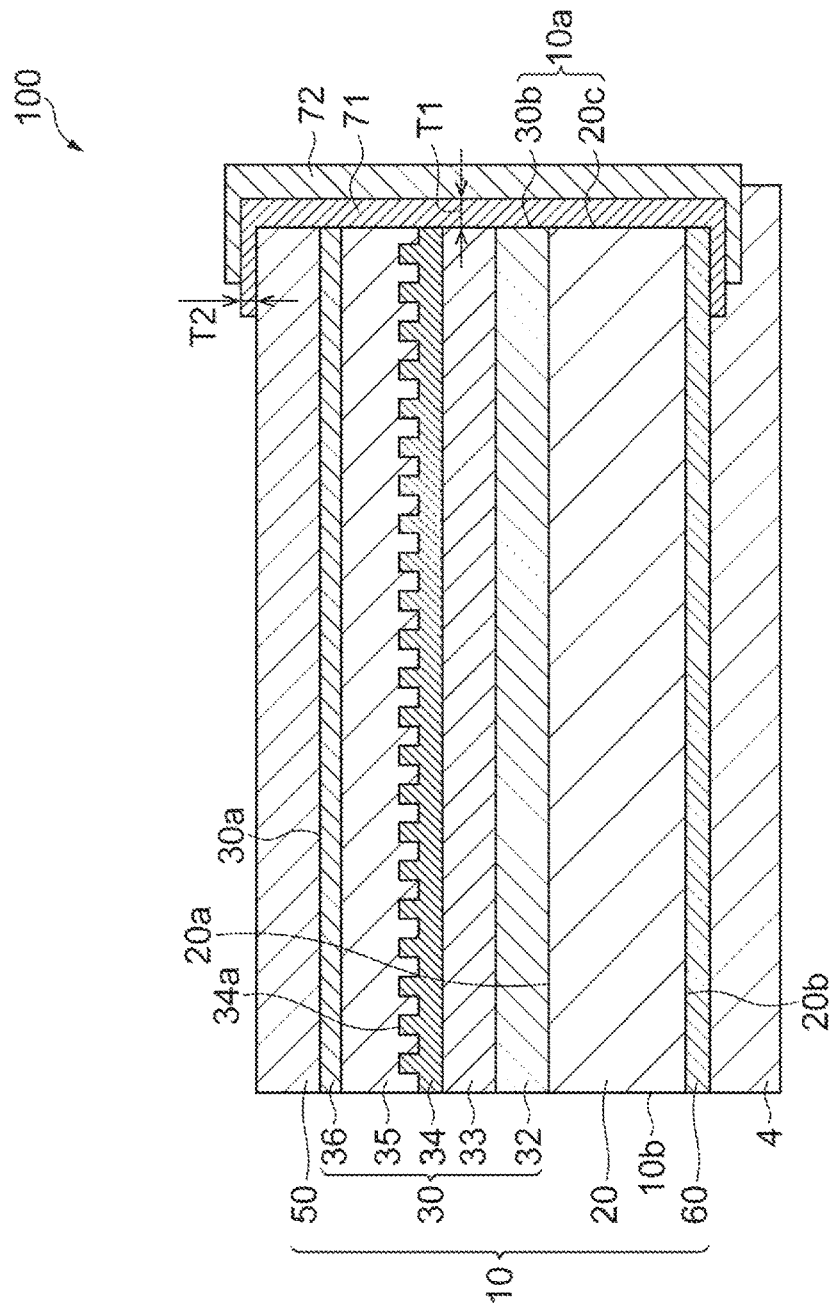
FIG. 11 is a cross-sectional view taken along line XI-XI shown in FIG. 10.

A description will be given of the structure of a quantum cascade laser having a metal film on the end face thereof. FIG. 10 is a perspective view showing a quantum cascade laser 100. FIG. 11 is a cross-sectional view taken along line XI-XI shown in FIG. 10. For easy understanding, an XYZ coordinate system is depicted in each figure, and in the present embodiment, X-, Y-, and Z-directions are orthogonal to each other. Please note that, in order to show a conductive path through the solder material, FIG. 11 shows not only the quantum cascade laser 100 but also the solder material 4, which is used in fixing the quantum cascade laser 100 to a submount. The quantum cascade laser 100 has a buried-heterostructure similar to that of the quantum cascade laser 1 of the present embodiment. As shown in FIG. 9, the quantum cascade laser 100 includes a semiconductor device portion 10, an insulating film 71, and a metal film 72.

The quantum cascade laser 100 is different from the quantum cascade laser according to the embodiment in that the quantum cascade laser 100 does not include semiconductor insulating portion 75. The upper electrode 50 cover the entire second area 30d, and the insulating film 71 and the metal film 72 are disposed on the upper electrode 50. Mounting the quantum cascade laser 100 on the submount with the solder material 4 causes the metal film 72 on the lower electrode 60 to make contact with the solder material 4. The application of an external voltage (for example, a high voltage of 10 volts or more) between the upper and lower electrodes 50 and 60 enabling laser oscillation in the quantum cascade laser 100 results in the application of the voltage thus applied on the lower electrode 60 to the metal film 72 via the solder material 4. The external voltage, consequently, is applied to the insulating film 71 between the upper electrode 50 and the metal film 73 on the upper electrode 50.

As described above, the thickness T2 of the insulating film 71 on the upper electrode 50, however, is extremely thinner than the thickness T1 of the insulating film 71 on the rear end face 10a. The above high voltage of, for example, 10 volt or more may be applied to the insulating film 71, which is disposed between the upper electrode 50 and the metal film 72, to cause breakdown of the insulating film 71. This breakdown may from a current path in the insulating film 71, which allows a large amount of current (that is, inrush current) to flow in the vicinity of the rear end face 10a therethrough, so that the quantum cascade laser 100 may be subject to failure, such as breakage at an end face. Making an insulating film on the upper electrode 50 thick provides the resultant insulating film on the rear end face 10a with a large thickness (for example, several times thicker than before). Forming this thick film increases deposition time to form the insulating film 71 on the rear face 10a (for example, several times longer), thereby reducing the productivity of the quantum cascade laser 100. An insulating film with such a large thickness may make stress to the rear end face 10a large, and this stress may cause deterioration of the rear end face 10a, such as cracking of the insulating film 71, and peeling-off from the rear end face 10a.

In contrast, as shown in FIG. 3, the quantum cascade laser 1 according to the present embodiment is provided with the semiconductor insulating portion 75, which is between the second area 30d and the metal film 72 and is provided with the face 75c higher than the top face 30a of the semiconductor laminate 30, to allow an insulating region (including the insulating film 71 and the semiconductor insulating portion 75) to have a desired thickness, so that this insulating region makes an insulating property between the upper electrode 50 and the metal film 72 enhanced. The above-described quantum cascade laser 1 allows the above electrical insulation between the upper electrode 50 and the metal film 72 on the top face 75c to endure the voltage applied to the insulating film 71 between the upper electrode 50 and the metal film 72 on the top face 75c, thereby suppressing degradation of the device characteristics of the quantum cascade laser 1. Disposing the semiconductor insulating portion 75 between the second area 30d and the metal film 72 prevents the metal film 72 from making contact with the upper electrode 50, thereby avoiding the short circuit between the upper electrode 50 and the metal film 72.

The insulating film 71 is disposed between the laminate end face 30b and the metal film 72 and extends on the top face 75c, thereby reducing the occurrence of the short circuit between the laminate end face 30b and the metal film 72. The reduction in the occurrence of the short circuit can suppress degradation due to the device failures in the quantum cascade laser 1. In addition, as in the present embodiment, the insulating film 71 may include at least one of $SiO_2$, SiON, SiN, alumina, BCB resin, and polyimide resin, each of which have excellent durability and insulating properties for use in a protective film for the rear end face 10a. Further, these dielectric films are provided by a familiar method, such as sputtering, CVD, or spin coating, thereby being easily formed on the rear face 10a. Using these methods makes introduction of the deposition of the insulating film 71 into the fabricating process of the quantum cascade laser 1 easy.

In the present embodiment, the metal film 72 may include Au. Au can provide the metal film 72 on the rear face 10a with a high reflectivity of, for example, more than 90 percent.

In the present embodiment, the semiconductor insulating portion 75 includes semiconductor, such as III-V compound semiconductor, doped with a transition metal including at least one of Fe, Ti, Cr, and Co (dopant). The III-V compound semiconductor that is doped with the transition metal has a specific resistance of, for example, $10^5$ Ωcm or more to electrons, which is sufficiently high.

In the present embodiment, the metal film 72 may include gold (Au), which has a high reflectance of 90 percent or more at the rear end face 10a.

In the present embodiment, the upper cladding layer 35 may include an InP layer. InP is transparent (no absorption of light) to lasing light in the mid-infrared wavelengths, and can be used as material of the upper cladding layer 35. InP also is a binary mixed crystal, which is lattice-matched to the semiconductor substrate 20 of InP, so that an InP layer can be satisfactorily grown on the InP substrate. Further, InP has an excellent thermal conductivity, and can dissipate heat from the core layer 33 through the upper cladding layer 35 satisfactorily. This excellent thermal conductivity can provide the quantum cascade laser 1 with excellent temperature characteristics.

In the present embodiment, the semiconductor substrate 20 may be an InP base. The semiconductor laminate 30 of the quantum cascade laser 1 has a lattice constant close to that of InP. Using the InP base for the semiconductor substrate 20 allows the growth of the semiconductor laminate 30 on the semiconductor substrate 20 with an excellent crystal quality. InP is transparent to light in the mid-infrared wavelengths, so that the InP substrate can work as a lower cladding layer for the core layer 33.

First Modification

Figure 12:
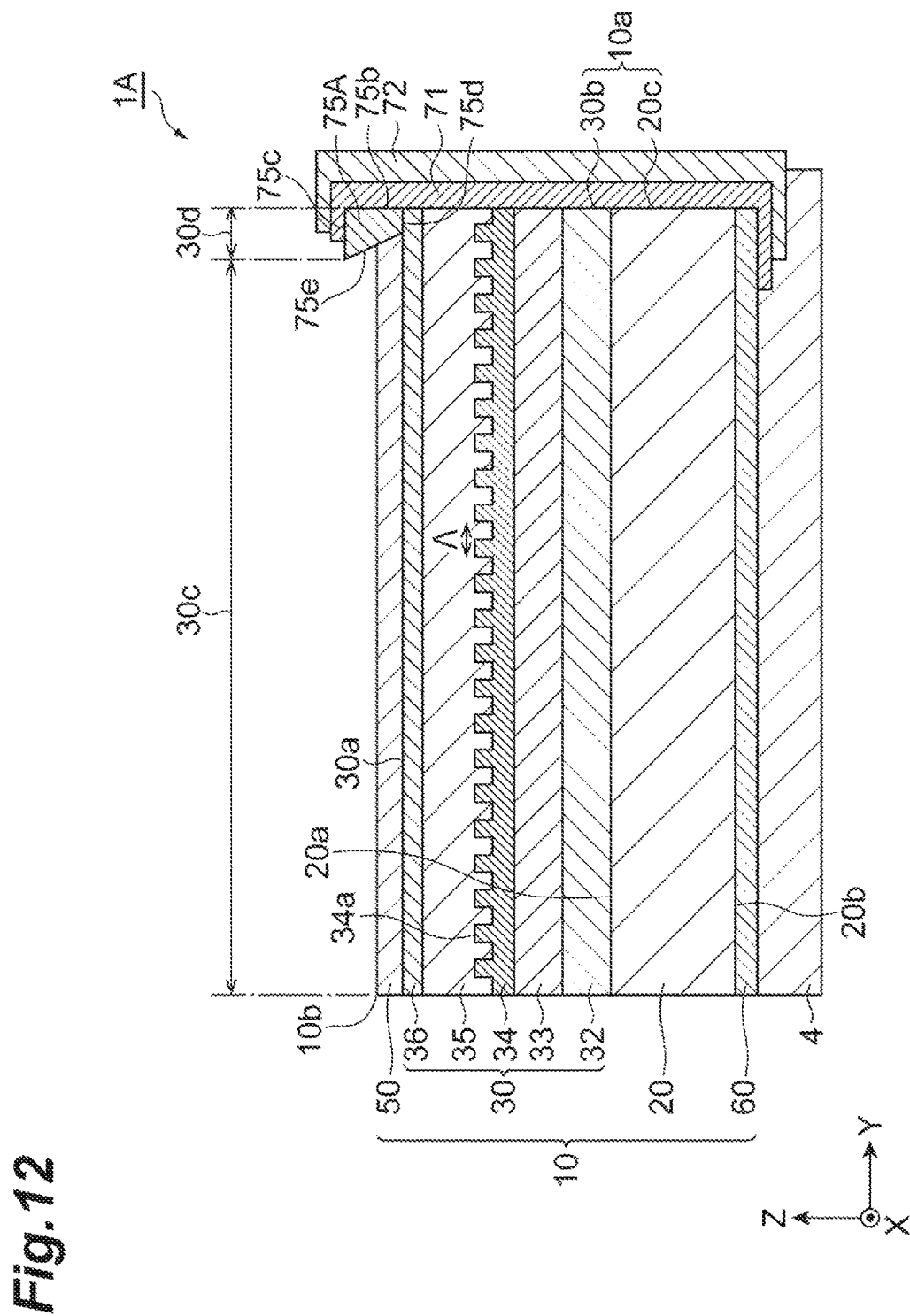
FIG. 12 is a perspective view showing a quantum cascade semiconductor laser according to a first modified example.

FIG. 12 is a perspective view showing the quantum cascade laser 1A according to the first modification of the embodiment. FIG. 12 is a cross sectional view, taken along a plane parallel to the YZ-plane in the present embodiment, showing the semiconductor laminate 30. The present modification is different from the above embodiment in that the semiconductor insulating portion 75 has an inclined side face. The side face 75a of the semiconductor insulating portion 75 in the embodiment is substantially parallel to the reference plane along which the rear end face 10a extend, and the side face 75a of the semiconductor insulating portion 75 in this modified example is inclined with the relevant reference plane (which is parallel to the substrate end face 20c and the laminate end face 30b) to provide the semiconductor insulating portion 75 with an inverted-mesa shape. Specifically, the semiconductor insulating portion 75 is provided with a sloping side face to form a peak at the top thereof. The side face 75e obliquely extend from the top face 30a in a upward direction at an acute angle with respect to the top face 30 and is oriented to the top face 30a to be peaked at the top thereof such that the vector normal to the side face 75e. The side face forms an angle in a range of more than zero degrees and less than 90 degrees.

The inclination of the side face 75e hinders the flux for the metal film 72 from being deposited on the side face 75e in depositing the metal film 72 on the rear end face 10a. The metal film 72 is terminated at the edge shared by the top face 75c and the sloping side face 75e, thereby reducing the occurrence of short circuit caused by the connection between the metal film 72 and the upper electrode 50. This results in preventing failures due to the short circuit from occurring in the quantum cascade laser 1A.

The method for fabricating the quantum cascade laser 1A is different from that for fabricating the quantum cascade laser 1 in that a process for etching the semiconductor layer 76 (FIG. 6B). In the method for fabricating the quantum cascade laser 1A, the semiconductor layer 76 is processed by an anisotropic wet etching. An appropriate etchant for this etching and an appropriate crystal plane of the semiconductor layer 76 allow the semiconductor insulating portion 75 to have a peaked side face 75e. The remaining processes can be the same as those according to the above embodiment.

Second Modification

Figure 13:
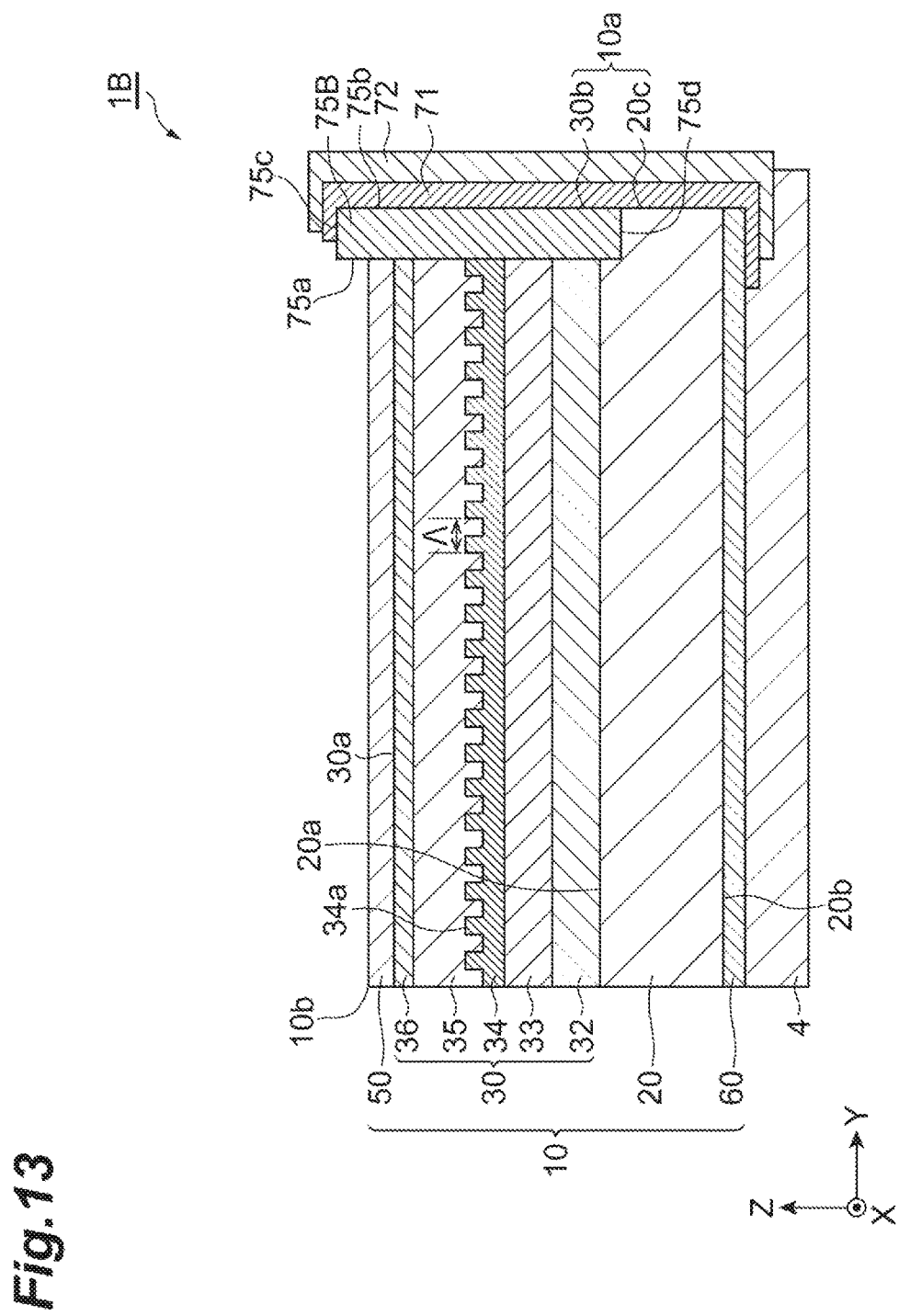
FIG. 13 is a perspective view showing a quantum cascade semiconductor laser according to a second modified example.

FIG. 13 is a perspective view showing a quantum cascade laser 1B according to the second modification of the above embodiment. FIG. 13 is a cross sectional view, taken along a plane parallel to the YZ-plane, showing the semiconductor laminate 30. The modified example is different from the above embodiment in the shape of the semiconductor insulating portion. The semiconductor insulating portion 75B is in the laser strip containing the semiconductor laminate 30, and extends along the rear end face 10a. The semiconductor insulating portion 75B extends to the semiconductor substrate 20 in a direction from the top face 30 to the back face 20b. The semiconductor insulating portion 75B is provided with the inner side face 75a, the outer side face 75b, the top face 75c, and the bottom face 75d. The inner side face 75a makes contact with both the end faces of the semiconductor layers (32, 33, 34, 35, and 36) stacked on the semiconductor substrate 20 and the side face of the semiconductor substrate 20 at a difference in level of the semiconductor substrate 20, and the semiconductor insulating portion 75B covers all of the end faces of the semiconductor layers (32, 33, 34, 35, and 36). The bottom face 75d makes contact with the recessed top face of the difference in level of the semiconductor substrate 20. The semiconductor insulating portion 75B extending along a part of the rear end face 10a allows the quantum cascade laser 1B to have a large electrical resistance in the vicinity of the rear end face 10a, thereby reducing a leakage current flowing in the vicinity of the rear end face 10a. This results in that the quantum cascade laser 1B has excellent device performances (e.g., a reduced threshold current). The semiconductor insulating portion 75B of a height larger than that of the semiconductor insulating portion 75 in the Z direction further reduces the occurrence of the breakdown of the insulating film 71 in the vicinity of the rear end face 10a.

Subsequently, a description will be given of an exemplary method for fabricating the quantum cascade laser 1B according to the present modification. FIGS. 14A to 14C are views each showing a fabricating process for the quantum cascade laser 1B of FIG. 13. The present method includes multiple process steps including a former part, which has the same process steps as those in the first embodiment method and ends at the process of forming separated embedding portions 40 (FIG. 5C) embedding the semiconductor laminates 30, and a latter part carried out after the following intermediate part. In the second modified example, the second crystal growth step grows one or more semiconductor films on the diffraction grating layer 34 to form a semiconductor product. The semiconductor product includes the contact layer 36 at the top thereof, and includes no semiconductor layer 76 thereon.

As shown in FIG. 14A, a mask 84 is formed on the semiconductor film for the contact layer 36 of the semiconductor laminate 30 by film formation and photolithography, and has a pattern on an area for the first area 30c and an opening on an area for the second area 30d. The mask 84 is made of the same material as that of the mask 81. The semiconductor laminate 30 is etched with the mask 84, and this etching leaves the semiconductor that is covered with the pattern, and removes the semiconductor that appears at the opening, thereby forming a recess, which has a bottom in the semiconductor substrate 20. The etching provides the semiconductor laminate 30 with the laminate end face 30b, which is at the boundary between the two areas for the first and second areas 30c and 30d. The etching is followed by a fourth crystal growth process with the mask 84, which is left on the wafer. As shown in FIG. 14C, in the fourth crystal growth process, the semiconductor insulating portion 76 is grown with the mask 84 on the laminate end face 30b of the recess. The latter part has the same processes as the above embodiment.

FIG. 15 is a perspective view showing a quantum cascade laser 1C according to another example of the second modification. FIG. 15 shows a cross section, taken along a plane parallel to the YZ-plane, showing the semiconductor laminate 30 of the quantum cascade laser 1C. The quantum cascade laser 1C has a semiconductor insulating portion 75B, which makes contact with the metal film 72 without an insulating film 71, and includes no insulating film 71 on the laminate end face 30b and the semiconductor insulating portion 75B. The metal film 72 covers all over the side face 75b of the semiconductor insulating portion 75B. The quantum cascade laser excludes the insulating film 71, and the semiconductor laminate 30 is in contact with the semiconductor insulating portion 75B exhibiting a high thermal conductivity. The direct contact can provide the quantum cascade laser 1C with a high heat dissipation at the semiconductor laminate 30, so that quantum cascade laser 1C is provided with an excellent device performance and an excellent reliability. The quantum cascade laser 1C uses the semiconductor insulating portion 75B as an insulating member. The quantum cascade laser 1C can be fabricated in the same manner as that of the quantum cascade laser 1B.

Third Modification

Figure 16:
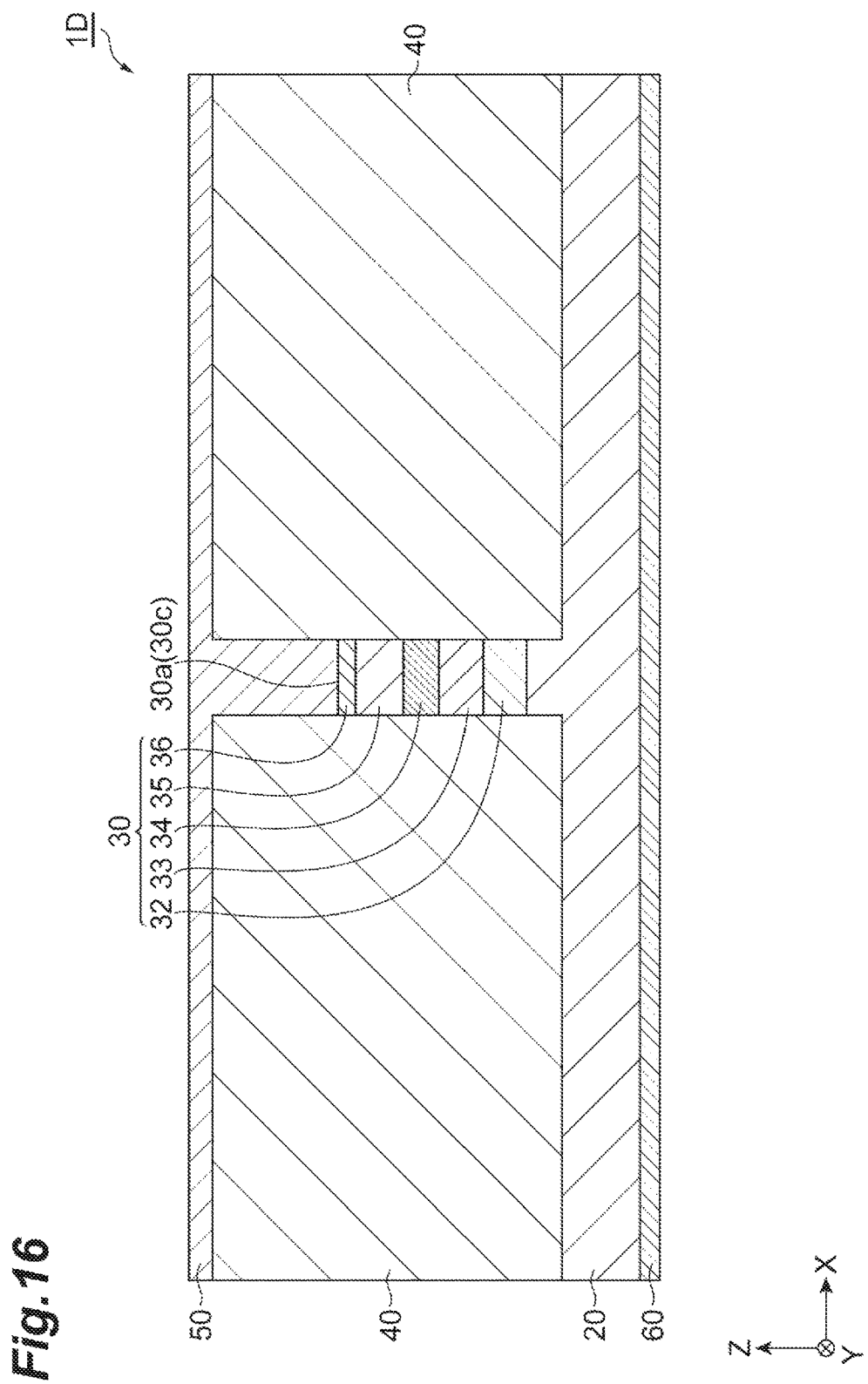
FIG. 16 is a perspective view showing a quantum cascade semiconductor laser according to a third modified example.
Figure 17:
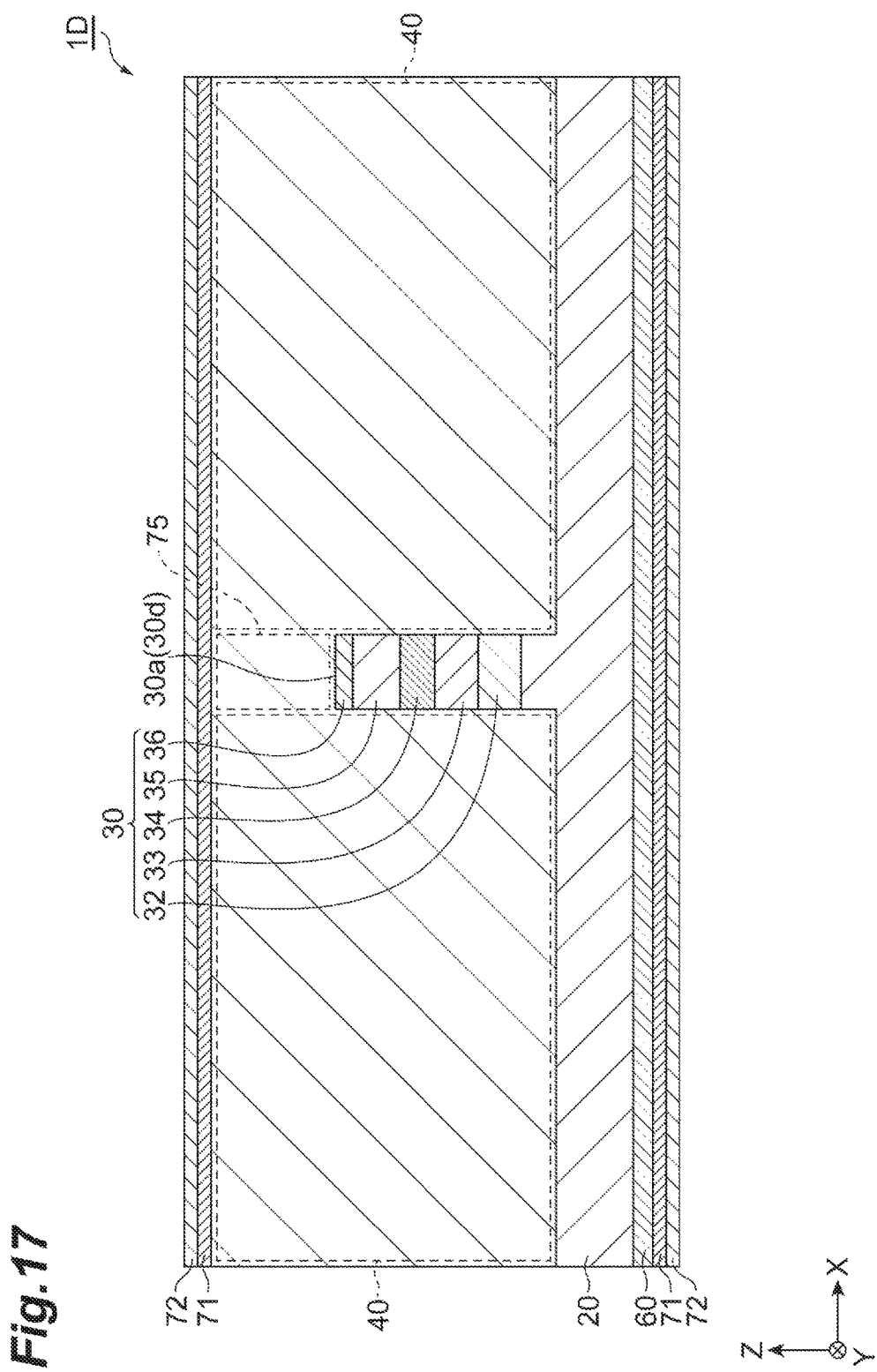
FIG. 17 is a perspective view showing a quantum cascade semiconductor laser according to the third modified example.

FIGS. 16 and 17 are cross sectional views each showing a quantum cascade laser 1D according to the third modification of the above embodiment. FIG. 16 shows a cross section, taken along a plane parallel to the YZ-plane, illustrating the first area 30c of the semiconductor laminate 30. FIG. 17 shows a cross section, taken along a plane parallel to the YZ-plane, illustrating the second area 30d of the semiconductor laminate 30. This modified example is different from the above embodiment in two current blocking portions and a semiconductor insulating portion. The semiconductor insulating portion 75B is made of the same material as that of the current blocking portions. Semiconductor for the semiconductor insulating portion 75B and the current blocking portions is grown on both the semiconductor substrate and the semiconductor laminate in the same semiconductor growth step. The current blocking portions protrudes with respect to the top of the semiconductor laminate 30 in the direction from the semiconductor substrate to the semiconductor laminate 30, so that the semiconductor insulating portion 75B is disposed on the top of the semiconductor laminate 30.

Figure 18A:
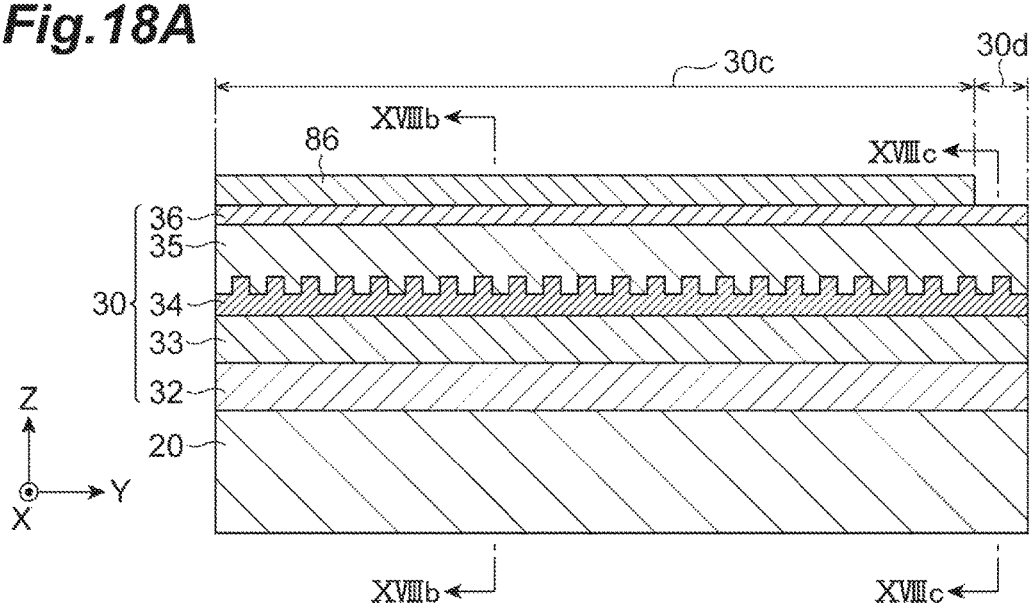
FIG. 18A is a schematic view showing a major process in a method for fabricating the quantum cascade semiconductor laser, shown in FIGS. 16 and 17.
Figure 18B:
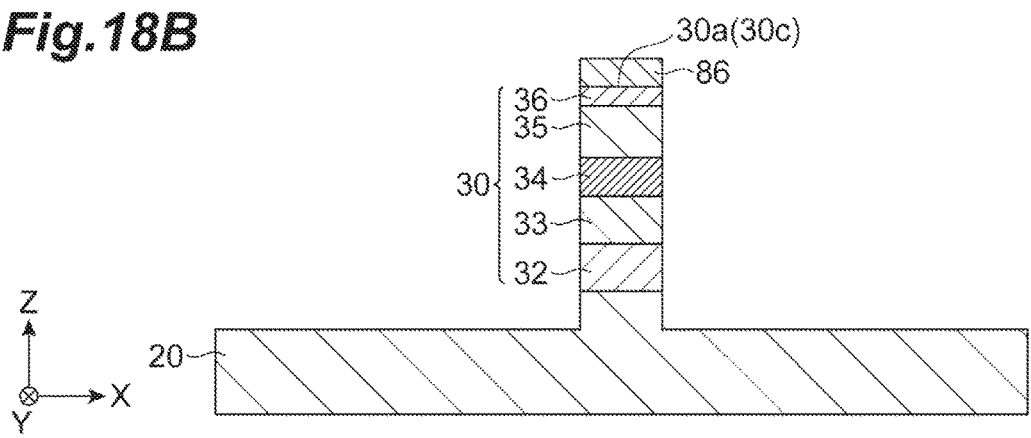
FIG. 18B is a schematic view showing a major process in the method according to the embodiment.
Figure 18C:
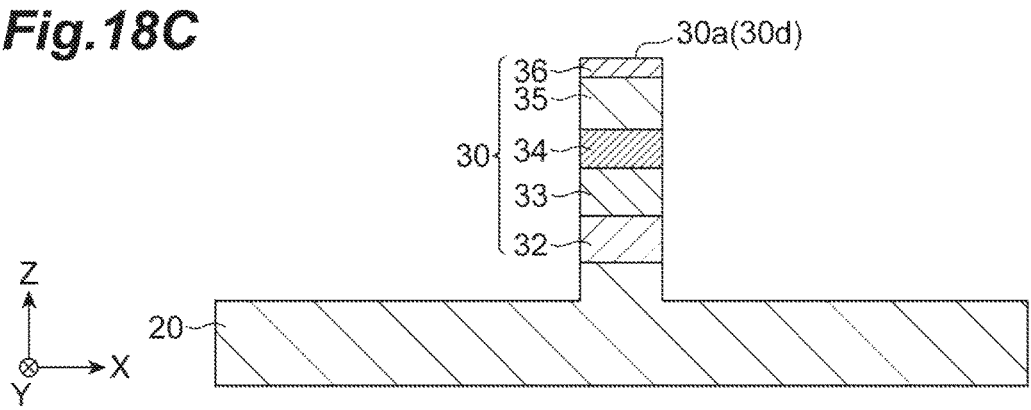
FIG. 18C is a schematic view showing a major process in the method according to the embodiment.

A description will be given of a method for fabricating the above quantum cascade laser 1D below. FIGS. 18A to 18C and FIGS. 19A to 19C are views each showing a major process of fabricating the quantum cascade laser 1D shown in FIGS. 16 and 17. FIGS. 18A to 18C show cross sections in a single process step for fabricating the quantum cascade laser 1D. FIGS. 19A to 19C show cross sections in a process step following that of FIGS. 18A to 18C. FIGS. 18A and 19A each show the cross section, taken along a plane parallel to the YZ plane, of the semiconductor laminate 30 of the quantum cascade laser 1D. FIG. 18B shows the cross section taken along a plane parallel to the XZ plane and line XVIIIb-XVIIIb of FIG. 18A, and FIG. 18C shows the cross section taken along a plane parallel to the XZ plane and line XVIIIc-XVIIIc of FIG. 18A. FIG. 19B shows the cross section taken along a plane parallel to the XZ plane and line XIXb-XIXb of FIG. 19A, and FIG. 19C shows the cross section taken along a plane parallel to the XZ plane and line XIXc-XIXc of FIG. 19A.

The method of fabricating the quantum cascade laser 1D according to the present modification has a former part that ends at a process for forming the mesa-shaped semiconductor laminate 30 (with reference to FIG. 5B), and a latter part following an intermediate part which begins with a second crystal growth process. In the modified example, the second crystal growth process grows one or more semiconductor films, including a contact layer 36 at the top of the one or more semiconductor films, on the diffraction grating layer 34 and does not grow the semiconductor layer 76 on the contact layer 36, thereby forming a semiconductor product. The semiconductor product is provided with the contact layer 36 at the top thereof and includes no semiconductor layer 76, After the step for forming the mesa-shaped semiconductor laminate 30, the mask 81 is removed, and as shown in FIGS. 18A and 18B, a mask 86 is formed on the upper face 30a of the mesa-shaped semiconductor laminate 30. As shown in FIGS. 18A to 18C, the mask 86 covers the first area 30c and has an opening on the second area 30d. The mask 86 is made of the same material as the mask 81 of the above embodiment. As shown in FIGS. 19A to 19C, selective growth is conducted with the mask 86 to grow two current block portions 40 and the semiconductor insulating portion 75 on both sides of the semiconductor laminate 30 and on the second area 30d, respectively, so that no semiconductor is deposited on the mask 86. Thereafter, the mask 86 is removed. The latter part (which begins with the step for forming the upper electrode 50 on the first area 30c) is the same as those in the above embodiment.

Selectively growing the semiconductor insulating portion 75 and the two current block portions 40 makes the fabricating process of the quantum cascade laser 1D simplified, thereby fabricating the quantum cascade laser 1D easily. This simplification provides the fabrication of the quantum cascade laser 1D with an improved productivity. Growing the semiconductor insulating portion 75 and the current block portions 40 simultaneously provides the semiconductor insulating portion 75 and the current block portions 40 with the same material and no interface therebetween, resulting in less crystal defects thereat. The less defective quantum cascade laser 1D can suppress degradation of device characteristics and deterioration of reliability. The quantum cascade laser 1D has the same advantageous effects as the above embodiment.

Fourth Modification

Figure 20:
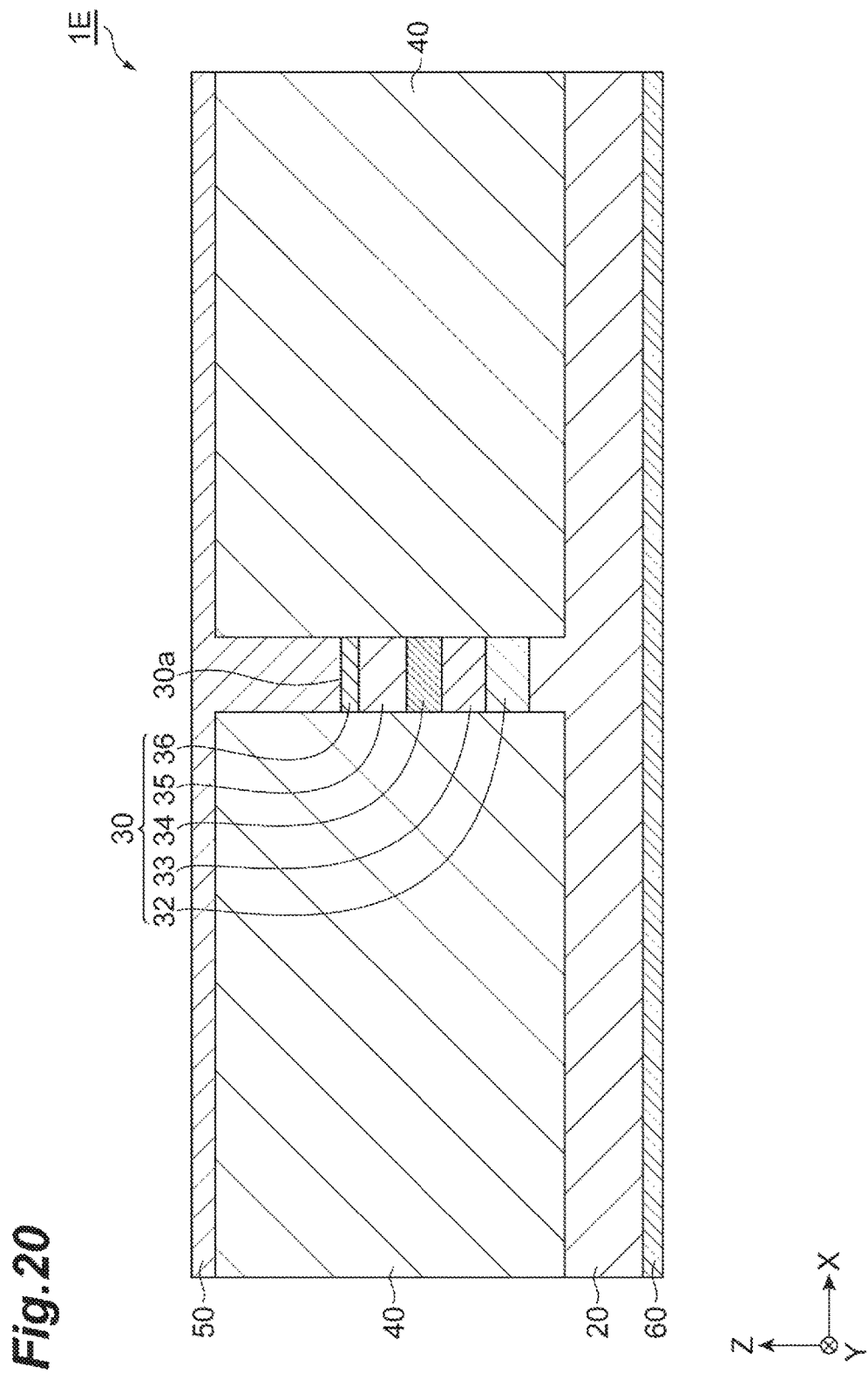
FIG. 20 is a perspective view showing a quantum cascade semiconductor laser according to a fourth modified example.
Figure 21:
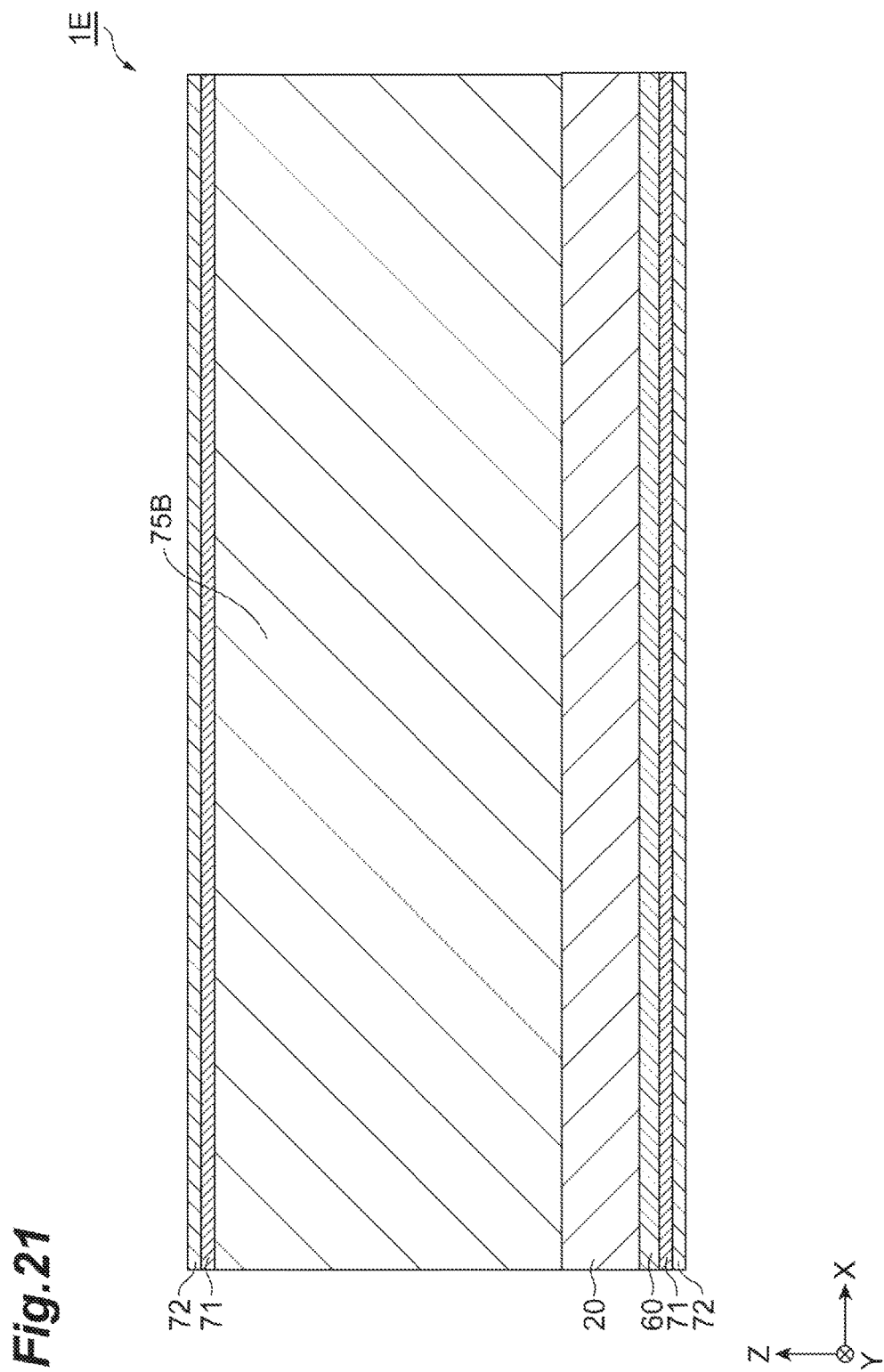
FIG. 21 is a perspective view showing a quantum cascade semiconductor laser according to the fourth modified example.

FIGS. 20 and 21 are cross sectional views each showing a quantum cascade laser 1E according to a fourth modified example. FIG. 20 shows the cross section, taken along a plane parallel to the XZ plane, illustrating the semiconductor laminate 30, and FIG. 21 shows the cross section, taken along a plane parallel to the XZ plane, illustrating the semiconductor insulating portion 75. The present modified example is different from the above-described embodiment in the shape of two current block portions and a semiconductor insulating portion. Specifically, the quantum cascade laser 1E according to the modification includes the semiconductor insulating portion 75B, and the semiconductor insulating portion 75B and the two current block portions 40 are grown simultaneously with a selective growth mask, and are made of the same material. This simultaneous growth with the selective growth mask allows the current block portion 40 and the semiconductor insulating portion 75B to protrude with respect to the upper electrode 50 in a direction from the semiconductor substrate 20 to the semiconductor laminate 30.

Figure 22A:
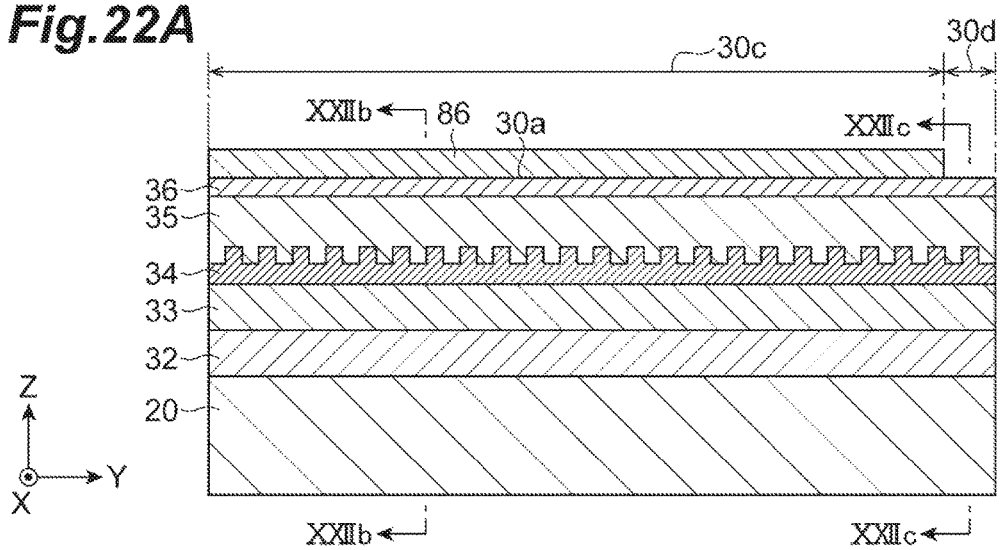
FIG. 22A is a schematic view showing a major process in a method for fabricating the quantum cascade semiconductor laser, shown in FIGS. 20 and 21.
Figure 22B:
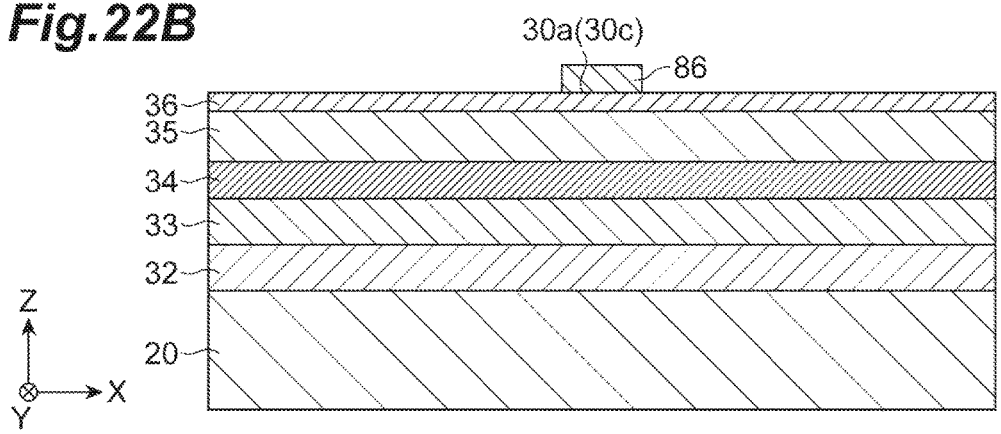
FIG. 22B is a schematic view showing a major process in the method according to the embodiment.
Figure 22C:
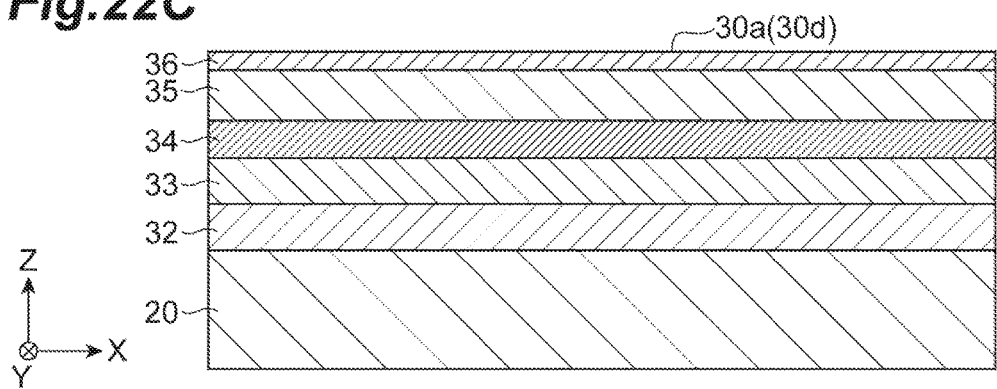
FIG. 22C is a schematic view showing a major process in the method according to the embodiment.
Figure 23A:
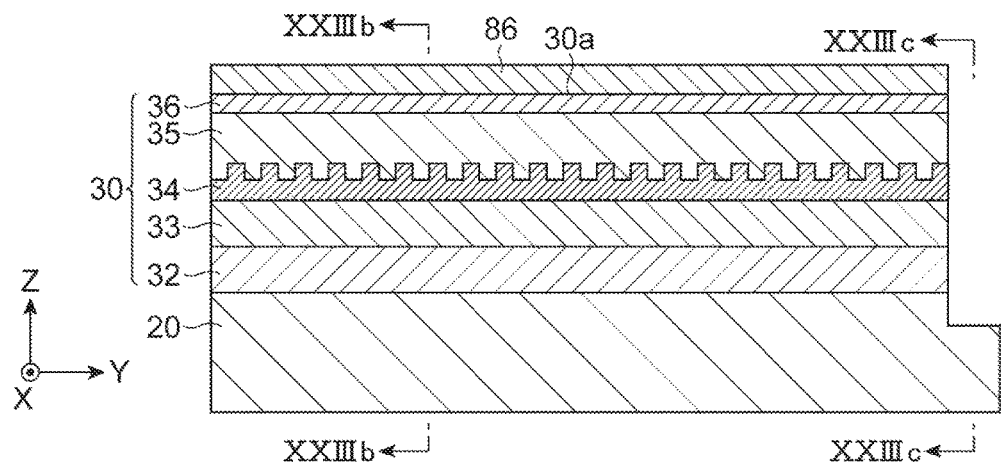
FIG. 23A is a schematic view showing a major process in the method according to the embodiment.
Figure 23B:
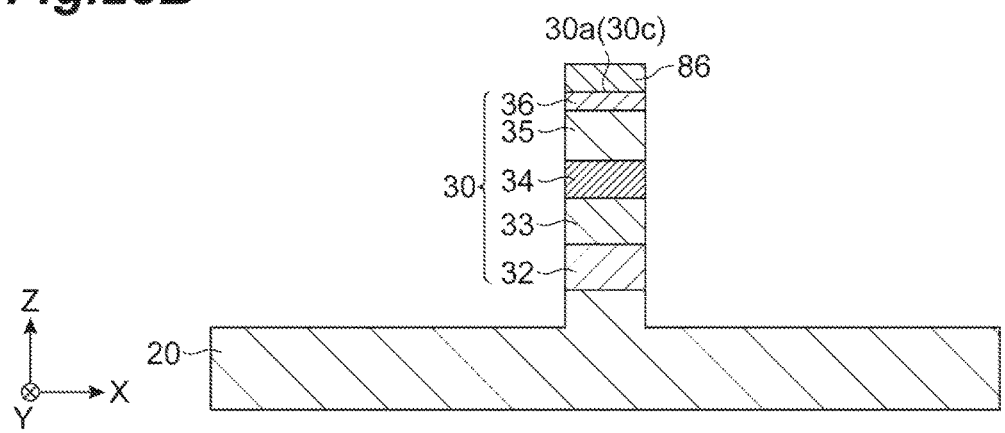
FIG. 23B is a schematic view showing a major process in the method according to the embodiment.
Figure 23C:
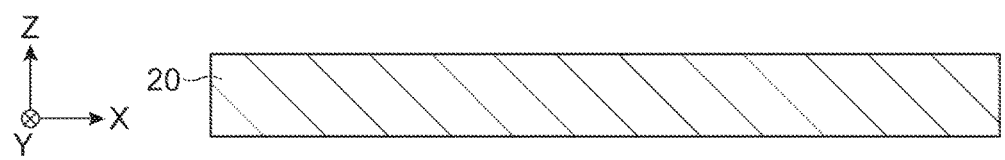
FIG. 23C is a schematic view showing a major process in the method according to the embodiment.
Figure 24A:
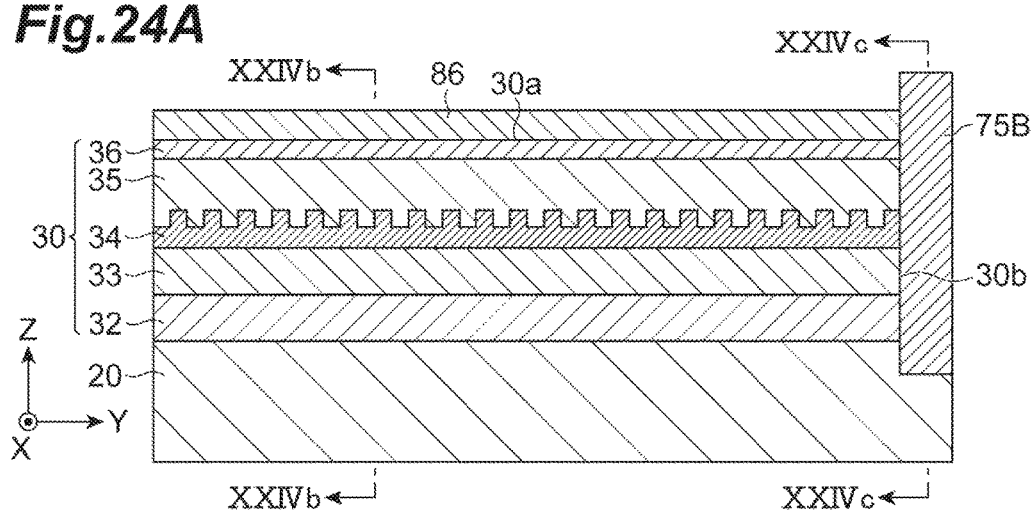
FIG. 24A is a schematic view showing a major process in the method according to the embodiment.
Figure 24B:
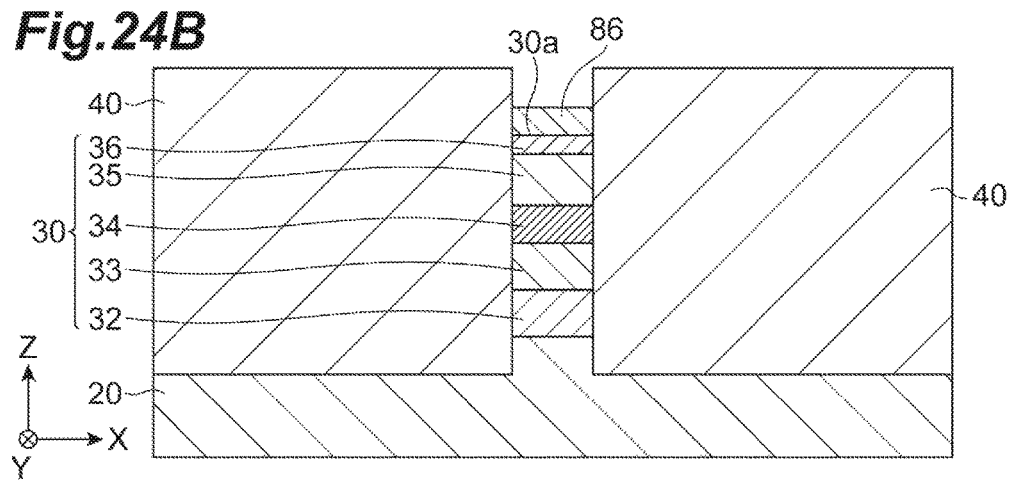
FIG. 24B is a schematic view showing a major process in the method according to the embodiment.
Figure 24C:
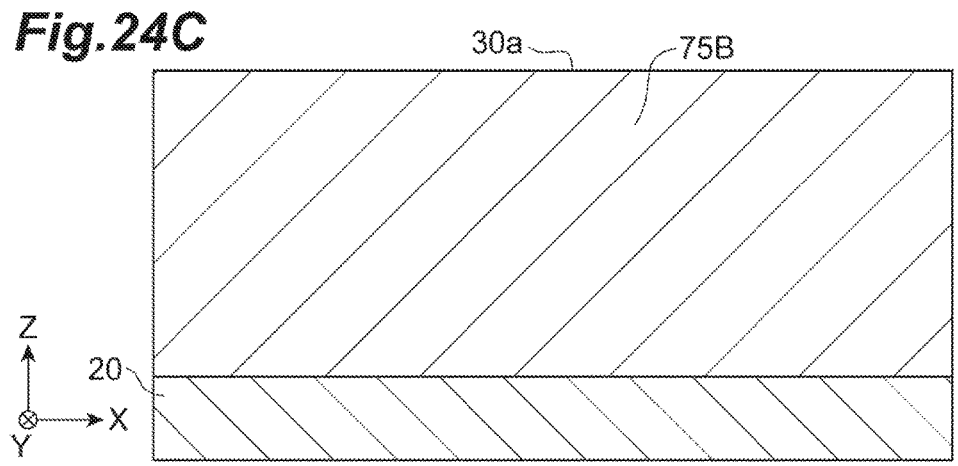
FIG. 24C is a schematic view showing a major process in the method according to the embodiment.

A description will be given of a method for fabricating the above quantum cascade laser 1E below. FIGS. 22A to 22C, FIGS. 23A to 23C, and FIGS. 24A to 24C are schematic views each showing a major process in the method for fabricating the quantum cascade laser 1E of FIGS. 20 and 21. FIGS. 22A to 22C show cross sections in a single process for fabricating the quantum cascade laser 1E. FIGS. 23A to 23C show cross sections in a process following that shown in FIGS. 22A to 22C. FIGS. 24A to 24C show cross sections in a process following that shown in FIGS. 23A to 23C. FIGS. 22A, 23A and 24A each show a cross section, taken along a plane parallel to YZ plane, illustrating the semiconductor laminate 30 of the quantum cascade laser 1E. FIGS. 22B shows a cross section taken along line XXIIb-XXIIb in FIG. 22A and a plane parallel to the XZ Plane, and FIG. 22C shows a cross section taken along line XXIIc-XXIIc in FIG.

22A and a plane parallel to the XZ plane. FIGS. 23B shows a cross section taken along line XXIIIb-XXIIIb in FIG. 23A and a plane parallel to the XZ plane, and FIG. 23C shows a cross section taken along line XXIIIc-XXIIIc in FIG. 23A and a plane parallel to the XZ plane. FIGS. 24B shows a cross section taken along line XXIVb-XXIVb in FIG. 24A and a plane parallel to the XZ plane, and FIG. 24C shows a cross section taken along line XXIVc-XXIVc in FIG. 24A and a plane parallel to the XZ plane.

The method for fabricating the quantum cascade laser 1E according to the present modification has a former part, which has the same process as that of the above embodiment and ends in the second crystal growth step (with reference to FIG. 4C), and a latter part following an intermediate part which begins with the second crystal growth process. In the modified example, the second crystal growth process grows one or more semiconductor films, which includes a contact layer 36 at the top of the semiconductor films on the diffraction grating layer 34, and does not grow the semiconductor layer 76 on the contact layer 36, thereby forming a semiconductor product. This semiconductor product is provided with the topmost contact layer 36, and includes no semiconductor layer 76.

Thereafter, as shown in FIGS. 22A to 22C, a mask 86 is formed on the upper face 30a. The mask 86 has a pattern covering the first area 30c, and an opening on the second area 30d. As shown in FIGS. 23A to 23C, the contact layer 36, the upper cladding layer 35, the diffraction grating layer 34, the core layer 33, the buffer layer 32 and the semiconductor substrate 20 are etched with the mask 86 to form a mesa-shaped semiconductor laminate 30, as shown in FIG. 23B, and the semiconductor laminate 30 has a laminate end face 30b, as shown in FIG. 23A, at the edge of the opening of the mask 86, or the edge of the pattern of the mask 86.

As shown in FIGS. 24A to 24C, two current block portions 40 and the semiconductor insulating portion 75B are selectively grown on both sides of the semiconductor laminate 30 and the laminate end face 30b, respectively, except for on the pattern of the mask 86. Thereafter, the mask 86 is removed in the last process of the intermediate part. The latter part begins with (the step of forming the upper electrode 50 on the upper surface 30a), and has the same processes as those in the above embodiment. The quantum cascade laser 1D according to the third modified example, which is fabricated using the selective growth of the semiconductor insulating portion 75B and the two current block portions 40, has the same advantageous effects as those of the above embodiment.

The quantum cascade laser according to the present invention is not limited to the above-described quantum cascade semiconductor lasers, and other modifications are possible. For example, the above-described embodiment and each of the modifications may be combined with each other in accordance with purposes and effects according to the above-described embodiments. The insulating film and the metal film are disposed on the rear end face of the semiconductor device in the above-described embodiments and modifications, but the insulating film and the metal film may be disposed on the front end face or on both the front and rear end faces of the semiconductor device. The quantum cascade laser according to the above-described embodiments and modifications each have a buried-heterostructure, and if needed, has another structure, such as a high mesa structure with an insulating film (for example, a dielectric film, such as $SiO_2$) formed on both side faces of the semiconductor laminate 30. Further, the above-described embodiments and modifications each have a DFB quantum cascade laser with the diffraction grating layer 34, but the present invention is not limited thereto. The above-described embodiments and modifications can be similarly applied to, for example, a Fabry-Perot (FP) type quantum cascade laser without the diffraction grating layer 34. The FP-type quantum cascade laser has the same improvement as the DFB type quantum cascade laser. The quantum cascade laser according to the above-described embodiments and modifications includes the upper electrode working as the cathode electrode, and the lower electrode working as the anode electrode. If needed, the quantum cascade laser according to the above-described embodiments and modifications may include the upper electrode working as the anode electrode and the lower electrode working as the cathode electrode as well. This quantum cascade laser has the same effects as the above-described embodiments and modifications.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A quantum cascade laser comprising:
   a semiconductor device portion including a substrate, a semiconductor laminate, and a semiconductor insulating portion, the substrate and the semiconductor laminate being arranged in a first direction, the semiconductor laminate being disposed on the substrate, the semiconductor laminate having a principal surface, the substrate having a back surface, the principal surface and the back surface being arranged in the first direction, the substrate having a substrate end face, the semiconductor laminate having a laminate end face, a core layer extending from the laminate end face in a second direction intersecting the first direction, and a cladding layer disposed on the core layer, the semiconductor insulating portion and the substrate being disposed along a reference plane intersecting the second direction, the semiconductor device portion having a front end face and a rear end face, the front end face and the rear end face being arranged in the second direction, the rear end face including the substrate end face, and the substrate end face extending along the reference plane;
   a first electrode disposed on the semiconductor laminate;
   a second electrode disposed on the back surface of the substrate; and
   a metal film disposed on the rear end face, the semiconductor insulating portion, and the second electrode, the metal film being apart from the first electrode.

2. The quantum cascade laser according to claim 1, wherein
   the principal surface of the semiconductor laminate has a first area and a second area,
   the first area and the second area of the principal surface are arranged in the second direction,
   the second area of the principal surface is disposed between the laminate end face and the first area of the principal surface,
   the semiconductor insulating portion is on the second area of the principal surface, and
   the first electrode has an end apart from the laminate end face and the second area of the principal surface.

3. The quantum cascade laser according to claim 2,
wherein the semiconductor insulating portion has an outer side face and an inner side face,
the outer side face and the substrate end face are arranged along the reference plane, and
the inner side face of the semiconductor insulating portion is inclined with the principal surface of the semiconductor laminate to form an acute angle.

4. The quantum cascade laser according to claim 1,
wherein the semiconductor insulating portion extends along the laminate end face.

5. The quantum cascade laser according to claim 4,
wherein the semiconductor insulating portion is in contact with the metal film.

6. The quantum cascade laser according to claim 1, further comprising an insulating film, the insulating film being between the laminate end face and the metal film.

7. The quantum cascade laser according to claim 6, wherein the insulating film includes at least one of $SiO_2$, SiON, SiN, alumina, a BCB resin, or a polyimide resin.

8. The quantum cascade laser according to claim 1,
wherein the semiconductor insulating portion includes semi-insulating semiconductor containing a transition metal as a dopant.

9. The quantum cascade laser according to claim 1,
wherein the semiconductor insulating portion, the semiconductor laminate, and the substrate are arranged along the reference plane.

10. The quantum cascade laser according to claim 1,
wherein the semiconductor insulating portion is in direct contact with the substrate.

11. The quantum cascade laser according to claim 1,
wherein the semiconductor laminate is between the semiconductor insulating portion and the substrate.

12. The quantum cascade laser according to claim 1,
wherein the semiconductor device portion includes a current blocking portion embedding the semiconductor laminate,
the current blocking portion includes at least one of semi-insulating or undoped semiconductor, and
the semiconductor insulating portion is made of the same material as that of the current blocking portion.

* * * * *